United States Patent
Koyama

(10) Patent No.: US 10,235,289 B2
(45) Date of Patent: Mar. 19, 2019

(54) STORAGE SYSTEM AND STORAGE CONTROL CIRCUIT

(71) Applicant: Semiconductor Energy Laboratory Co., Ltd., Atsugi-shi, Kanagawa-ken (JP)

(72) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/047,769

(22) Filed: Feb. 19, 2016

(65) Prior Publication Data

US 2016/0253260 A1    Sep. 1, 2016

(30) Foreign Application Priority Data

Feb. 26, 2015 (JP) .................................. 2015-036039

(51) Int. Cl.
*G06F 12/0804* (2016.01)
*G06F 12/0815* (2016.01)
(Continued)

(52) U.S. Cl.
CPC ...... *G06F 12/0804* (2013.01); *G06F 12/0815* (2013.01); *G11C 5/141* (2013.01);
(Continued)

(58) Field of Classification Search
CPC . G06F 12/0804; G06F 12/0815; G11C 5/141; G11C 7/10; G11C 11/401
See application file for complete search history.

(56) References Cited

U.S. PATENT DOCUMENTS 5,724,285 A * 3/1998 Shinohara ........... G06F 11/0757
                                                          711/103
5,731,856 A   3/1998 Kim et al.
(Continued)

FOREIGN PATENT DOCUMENTS

EP       1737044 A       12/2006
EP       2226847 A        9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Aracelis Ruiz
(74) *Attorney, Agent, or Firm* — Fish & Richardson P.C.

(57) ABSTRACT

A storage system capable of retaining data even when power supply is stopped is provided. A storage system capable of reducing power that is necessary for retaining data is provided. A memory cell including a transistor with low off-state current is used as a cache memory. By utilizing the low off-state current, data is retained and refreshed at a frequency of approximately once an hour, whereby data can be retained semi-permanently. When power supply is temporarily stopped, data is retained using power which allows the transistor to be kept off, whereby power can be drastically reduced as compared with a configuration in which data is backed up.

14 Claims, 21 Drawing Sheets

(51) Int. Cl.
*G11C 5/14* (2006.01)
*G11C 7/10* (2006.01)
*G11C 11/401* (2006.01)

(52) U.S. Cl.
CPC .............. *G11C 7/10* (2013.01); *G11C 11/401* (2013.01); *G06F 2212/1032* (2013.01); *G06F 2212/281* (2013.01); *G06F 2212/312* (2013.01)

(56) References Cited

U.S. PATENT DOCUMENTS

| | | | |
|---|---|---|---|
| 5,744,864 | A | 4/1998 | Cillessen et al. |
| 5,784,548 | A * | 7/1998 | Liong .................. G06F 1/30 |
| | | | 711/106 |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,392,648 | B2 | 3/2013 | Yamamoto et al. |
| 8,635,400 | B2 | 1/2014 | Yamamoto et al. |
| 8,954,659 | B2 | 2/2015 | Yamamoto et al. |
| 8,957,881 | B2 | 2/2015 | Wakimoto et al. |
| 8,972,651 | B2 | 3/2015 | Kawamura et al. |
| 9,235,515 | B2 | 1/2016 | Tsutsui |
| 9,244,622 | B2 | 1/2016 | Yamamoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0245076 | A1 * | 10/2007 | Chang ..................... G06F 1/30 |
| | | | 711/112 |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0303630 | A1 * | 12/2009 | Zhou ..................... G06F 1/263 |
| | | | 360/55 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0101351 | A1 | 5/2011 | Yamazaki |
| 2011/0202728 | A1 * | 8/2011 | Nichols .................. G06F 9/461 |
| | | | 711/141 |
| 2012/0170355 | A1 * | 7/2012 | Ohmaru .................. G11C 11/24 |
| | | | 365/149 |
| 2013/0262765 | A1 | 10/2013 | Tsutsui |
| 2015/0049067 | A1 | 2/2015 | Wakimoto et al. |
| 2015/0127896 | A1 | 5/2015 | Kawamura et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |
| WO | WO-2011/010344 | 1/2011 |
| WO | WO-2013/051062 | 4/2013 |

(56) References Cited

FOREIGN PATENT DOCUMENTS

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu, or Zn] At Temperature Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW'02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZNO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

(56) References Cited

OTHER PUBLICATIONS

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2007, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

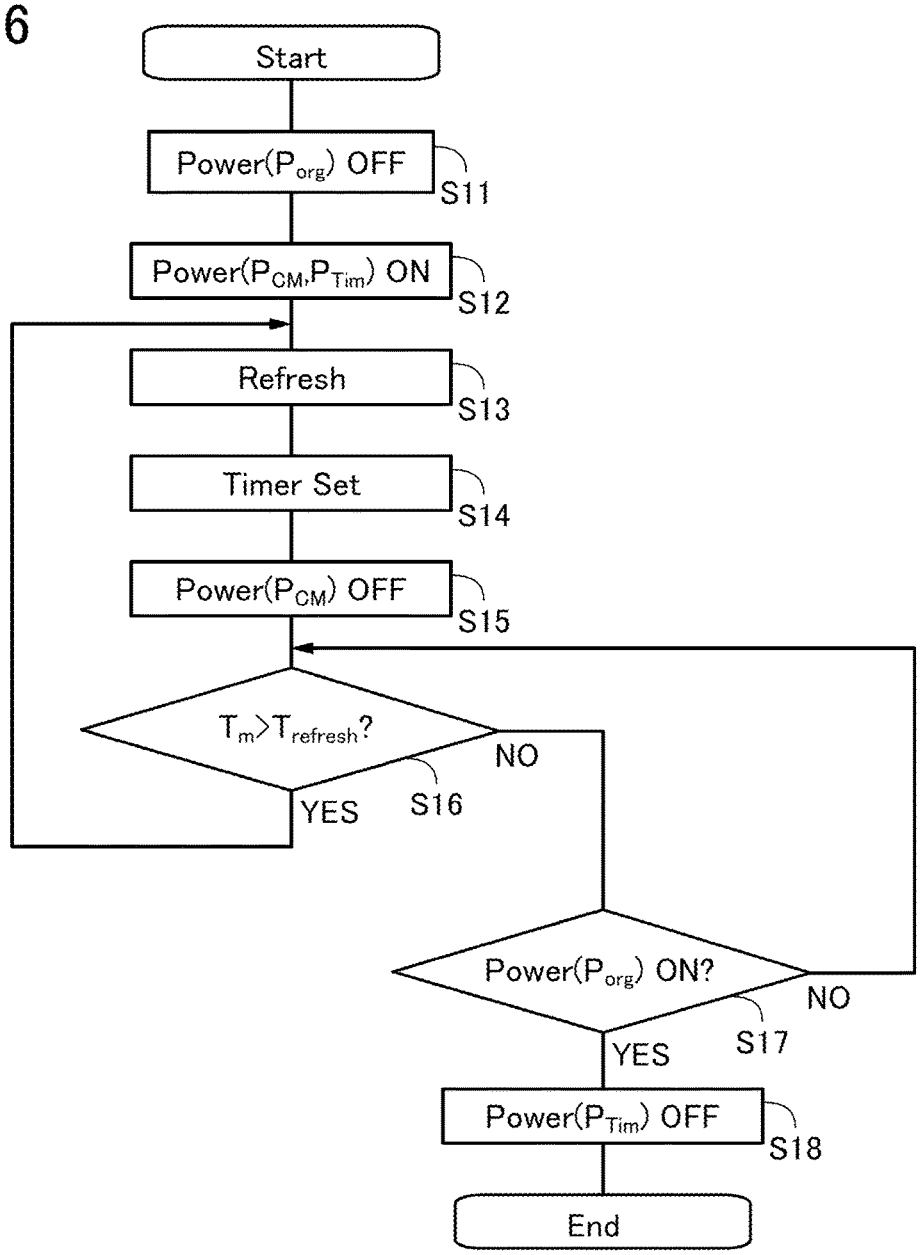

STORAGE SYSTEM AND STORAGE CONTROL CIRCUIT

BACKGROUND OF THE INVENTION

1. Field of the Invention

One embodiment of the present invention relates to a storage system and a storage control circuit.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, an imaging device, a memory device, a method for driving any of them, and a method for manufacturing any of them.

2. Description of the Related Art

A storage system is a system for collecting, managing, or choosing large complicated data sets such as big data. In a storage system, a flash memory is employed as storage. A flash memory is superior to a hard disk drive (HDD) in quietness, impact resistance, and the like and is therefore being employed as storage.

Although having a plurality of advantages, a flash memory is slower in data input and output than a dynamic random access memory (DRAM) or a static random access memory (SRAM). For this reason, a storage system additionally includes a cache memory which temporarily stores data for data input and output (see, for example, Patent Document 1). For example, a DRAM is employed as the cache memory.

A DRAM might lose data in the event of cut-off of power supply such as instantaneous power interruption. Therefore, as a countermeasure against data loss, a storage system is provided with a power storage device such as a capacitor or a battery so that data in a cache memory is stored in a flash memory (see, for example, Patent Document 2).

As a cache memory of a storage system, Patent Document 3 discloses a configuration with a memory cell including a transistor containing an oxide semiconductor (OS) in a channel formation region (this transistor is hereinafter referred to as an OS transistor). In Patent Document 3, the memory cell including the OS transistor is described as being capable of retaining data even when refreshed less frequently than a common DRAM.

PATENT DOCUMENTS

[Patent Document 1] PCT International Publication No. 2011/010344
[Patent Document 2] PCT International Publication No. 2013/051062
[Patent Document 3] United States Patent Application Publication No. 2013/0262765

SUMMARY OF THE INVENTION

There are many structures for the above-described storage system and a storage control circuit. The structures have merits and demerits, and an appropriate structure is selected depending on circumstances. Therefore, a proposal of a storage system and a storage control circuit having a novel structure leads to a higher degree of freedom of selection.

An object of one embodiment of the present invention is to provide a novel storage system and a novel storage control circuit. Another object of one embodiment of the present invention is to provide a novel semiconductor device or a novel system.

A configuration in which data of a cache memory is stored in a storage needs to secure power for storing the data in the storage in addition to power for refreshing the data. Therefore, a large power storage device is required.

In view of this, an object of one embodiment of the present invention is to provide a storage system or the like with a novel configuration capable of retaining data without storing data in a storage even when power supply is stopped. Another object of one embodiment of the present invention is to provide a storage system or the like with a novel configuration capable of reducing power that is necessary for retaining data.

Note that the objects of one embodiment of the present invention are not limited to the above objects. The objects described above do not disturb the existence of other objects. The other objects are ones that are not described above and will be described below. The other objects will be apparent from and can be derived from the description of the specification, the drawings, and the like by those skilled in the art. One embodiment of the present invention solves at least one of the above objects and the other objects.

One embodiment of the present invention is a storage system including a storage, a storage control circuit, and a host. The storage control circuit includes a controller, a cache memory, and a power storage device. The controller has a function of controlling data input and output between the storage and the host by access of the host. The cache memory includes a transistor. The transistor has a function of retaining a charge based on the data by being turned off. The power storage device has a function of supplying power for turning off the transistor in a state where power supply from outside is stopped.

In the storage system of one embodiment of the present invention, the transistor preferably contains an oxide semiconductor in a channel formation region.

In the storage system of one embodiment of the present invention, the transistor is preferably electrically connected to a capacitor and preferably has a function of retaining the charge based on the data in the capacitor by being turned off.

In the storage system of one embodiment of the present invention, it is preferable that the storage control circuit include a timer and the data be refreshed under control of the timer.

One embodiment of the present invention is a storage control circuit including a controller, a cache memory, and a power storage device. The controller has a function of controlling data input and output between a storage and a host by access of the host. The cache memory includes a transistor. The transistor has a function of retaining a charge based on the data by being turned off. The power storage device has a function of supplying power for turning off the transistor in a state where power supply from outside is stopped.

In the storage control circuit of one embodiment of the present invention, the transistor preferably contains an oxide semiconductor in a channel formation region.

In the storage control circuit of one embodiment of the present invention, the transistor is preferably electrically connected to a capacitor and preferably has a function of retaining the charge based on the data in the capacitor by being turned off.

In one embodiment of the present invention, it is preferable that the storage control circuit include a timer and the data be refreshed under control of the timer.

Note that other embodiments of the present invention will be shown in the following embodiments and the drawings.

One embodiment of the present invention can provide a novel storage system and a novel storage control circuit. Another embodiment of the present invention can provide a novel semiconductor device or a novel system.

Another embodiment of the present invention can provide a storage system or the like with a novel configuration capable of retaining data without storing data in a storage even when power supply is stopped. Another embodiment of the present invention can provide a storage system or the like with a novel configuration capable of reducing power that is necessary for retaining data.

Note that the effects of one embodiment of the present invention are not limited to the above effects. The effects described above do not disturb the existence of other effects. The other effects are ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

FIG. 6 is a flow chart illustrating one embodiment of the present invention.

DETAILED DESCRIPTION OF THE INVENTION

Figure 1A:
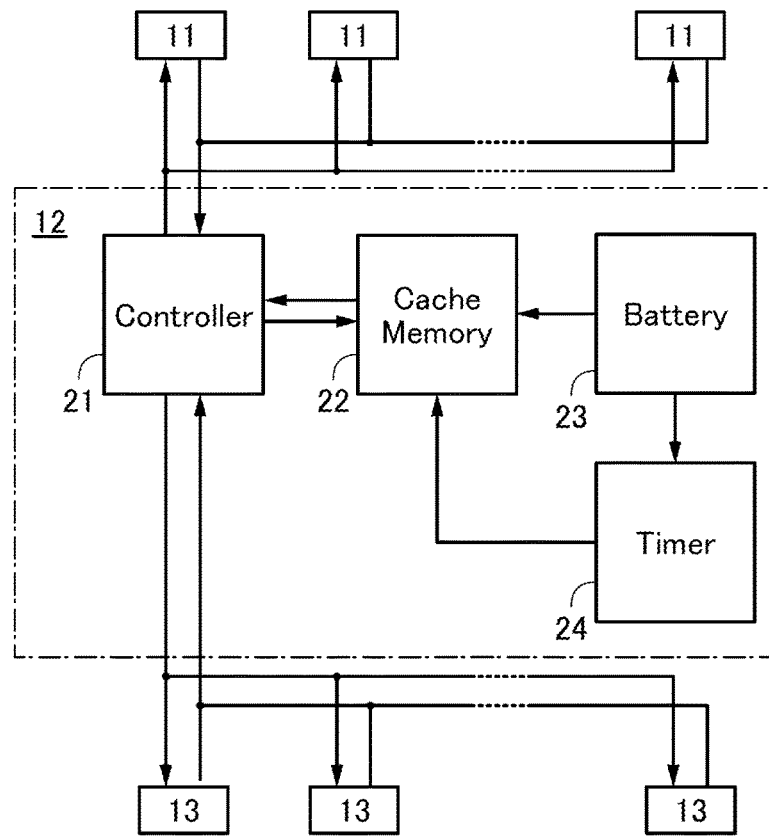
FIGS. 1A and 1B are a block diagram and a circuit diagram illustrating one embodiment of the present invention.

Embodiments will be hereinafter described with reference to drawings. Note that embodiments can be carried out in many different modes, and it is easily understood by those skilled in the art that modes and details of the present invention can be modified in various ways without departing from the spirit and the scope of the present invention. Therefore, the present invention should not be interpreted as being limited to the description in the following embodiments.

Note that ordinal numbers such as "first," "second," and "third" in this specification and the like are used in order to avoid confusion among components. Thus, the terms do not limit the number or order of components. For example, in the present specification and the like, a "first" component in one embodiment can be referred to as a "second" component in other embodiments or claims. Furthermore, in the present specification and the like, a "first" component in one embodiment can be referred to without the ordinal number in other embodiments or claims.

The same elements or elements having similar functions, elements formed using the same material, elements formed at the same time, or the like in the drawings are denoted by the same reference numerals in some cases, and the description thereof is not repeated in some cases.

Embodiment 1

In this embodiment, a storage system according to one embodiment of the disclosed invention will be described.

<Block Diagram of Storage System>

FIG. 1A is a block diagram of a storage system which is one embodiment of the present invention. FIG. 1A illustrates a host 11, a storage control circuit 12, and a storage 13. The storage control circuit 12 includes a controller 21 (indicated as "Controller" in the diagram), a cache memory 22 (indicated as "Cache Memory" in the diagram), a power storage device 23 (indicated as "Battery" in the diagram), and a timer 24 (indicated as "Timer" in the diagram).

The host 11 corresponds to a computer which accesses data stored in the storage 13. The host 11 is also referred to as a server in some cases. The host 11 may be connected to another host 11 through a network. Data input and output by the access of the host 11 to the storage 13 are performed through the storage control circuit 12. Data input to and output from the storage 13 and the host 11 are performed through the storage control circuit 12.

The storage 13 stores data that is output from the host 11. The storage 13 outputs necessary data by the access of the host 11. The storage 13 may be connected to another storage 13 through a network. The storage 13 should be capable of storing large-volume data. A hard disk drive (HDD) or a flash memory can be used as the storage 13. A flash memory is particularly preferable because it has excellent quietness and impact resistance and is superior to an HDD in access speed.

With the use of a flash memory as the storage 13, the data access speed of the storage 13 is improved, i.e., the time required for the storage 13 to store and output data is shortened, but is still significantly lower than that of a DRAM. In order to solve the problem of low access speed of the storage 13, a cache memory is normally provided in a storage system to shorten the time for data storage and output. A DRAM with high access speed is provided as the cache memory.

In FIG. 1A, the cache memory 22 is provided in the storage control circuit 12. Data exchanged between the host 11 and the storage 13 is first stored in the cache memory under the control of the controller 21 and then output to the host 11 or the storage 13.

As a memory cell for storing data in the cache memory 22, a DRAM with large data storage capacity is used. A DRAM is preferable because it has high access speed as described above. However, a DRAM requires several tens of times or more of data refreshing per second and therefore consumes a large amount of power.

A DRAM is a circuit including one transistor and one capacitor (1T1C). As the transistor, a transistor containing silicon in a channel formation region (Si transistor) is used. Since the leakage current in an off state (off-state current) of the Si transistor is large, the frequency of the above-described refreshing is high.

In the case where power supply is stopped, a DRAM cannot maintain a potential based on data and loses data. For this reason, in one possible configuration, a supercapacitor may be provided to secure power for storing data of the cache memory in the storage even when power supply is temporarily stopped. However, there remains a problem in that it takes time to recharge the supercapacitor.

In a configuration of one embodiment of the present invention, a transistor with low off-state current is used as a transistor for storing data of a cache memory. Specifically, a transistor containing an oxide semiconductor in a channel formation region (OS transistor) is used. With a configuration in which an OS transistor is used to retain a potential based on data, the frequency of refreshing can be decreased and power consumption can be reduced. The timer 24 generates a signal for controlling the timing of data refreshing at regular intervals. For example, the timer 24 outputs a pulse signal once an hour to perform refreshing in the cache memory 22.

In the configuration of one embodiment of the present invention, the storage control circuit 12 including the cache memory 22 includes the power storage device 23 and the timer 24. In the storage system, power is supplied from the power storage device 23 to the cache memory 22 and the timer 24 in the case where power supply is temporarily stopped. Therefore, in the case where power is supplied from the outside of the storage control circuit 12, the power of the power storage device 23 is not consumed.

Note that the power storage device 23 is preferably a secondary battery such as a lithium-ion battery. The secondary battery is preferable because it can be charged and discharged and can easily be downsized. Unlike a supercapacitor or the like, the secondary battery does not need to be charged after every discharge and it is therefore not necessary to provide charging time in advance.

In the cache memory 22, the use of an OS transistor enables the frequency of refreshing to be set to approximately once an hour. Therefore, the frequency of data refreshing is lower than that in a DRAM. Since less power is required for refreshing, the power storage device 23 can be downsized. Although the timer 24 also needs power from the power storage device 23, the timer 24 consumes low power and there is no problem even when the power storage device 23 is downsized.

For example, as the power storage device 23, a primary battery, specifically a small button battery, can be employed to supply power. It is acceptable as long as the power storage device 23 can supply power sufficient for data refreshing at a frequency of approximately once an hour and for the operation of the timer 24.

Note that the cache memory 22 can keep retaining data semi-permanently by regular refreshing. The frequency of refreshing at that time is very low as described above. This enables the cache memory 22 to keep retaining data with low power consumption.

Note that the memory cell included in the cache memory 22 has a circuit configuration in which a potential based on data can be retained using an OS transistor. For example, a configuration obtained by replacing a Si transistor of a DRAM with an OS transistor can be used.

Figure 1B:
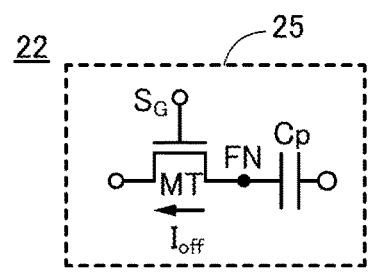

FIG. 1B illustrates an example of a circuit configuration of a memory cell 25 included in the cache memory 22. The memory cell 25 includes a transistor MT and a capacitor Cp. In the case where an OS transistor is used as the transistor MT, the off-state current (indicated as $I_{off}$ in the diagram) which flows between a source and a drain can be extremely low. When the transistor MT is kept off with a signal $S_G$ supplied to a gate of the transistor MT, a charge at a node FN between the transistor MT and the capacitor Cp can be retained and a potential based on data can be retained. The circuit configuration in FIG. 1B is the same as the circuit configuration of a DRAM including a Si transistor and has advantages such as high access speed for data reading and writing.

Although FIG. 1B illustrates an example of a configuration of a memory cell which retains a potential based on data by using a transistor and a capacitor, another configuration may be employed. For example, a configuration may be employed which retains data by retaining a charge at a node connected to one of a source and a drain of an OS transistor and a gate of a Si transistor. Alternatively, a configuration may be employed which is obtained by adding an OS transistor and a capacitor to an SRAM-based circuit configuration and which retains data by backing up data.

<Operation of Storage System>

Figure 2:
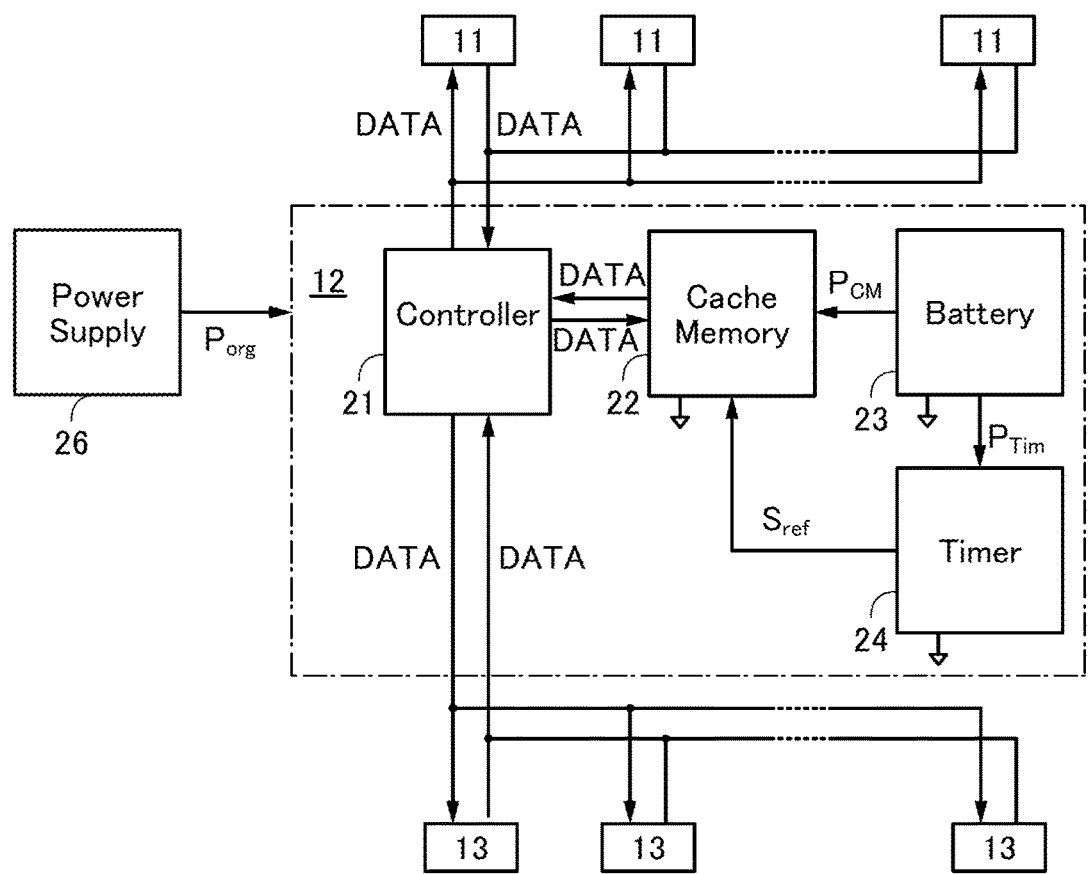
FIG. 2 is a block diagram illustrating one embodiment of the present invention.

Next, operation of the storage system illustrated in FIG. 1A will be described. In order to describe the operation, FIG. 2 schematically illustrates a signal, powers, and the like which are output from the components of the storage system. FIG. 2 also illustrates a power supply 26 (indicated as "Power Supply" in the diagram) which supplies power from the outside.

Note that the power supply 26 refers to a power supply other than the power storage device 23. For example, the power supply 26 may be a commercial power supply. Alternatively, the power supply 26 may be a power generator provided for the storage system or a power storage device other than the power storage device 23. Note that a voltage to be supplied from the power supply 26 is preferably converted into an appropriate voltage through a converter or the like before being supplied.

FIG. 2 illustrates data DATA which are input and output between the storage 13 and the cache memory 22. FIG. 2 also illustrates data DATA which are input and output between the host 11 and the cache memory 22. Note that in FIG. 2, data input to and output from the cache memory 22 are illustrated as being performed through the controller 21.

In FIG. 2, power supplied from the power supply 26 to the storage control circuit 12 is denoted by $P_{org}$; power supplied from the power storage device 23 to the cache memory 22 is denoted by $P_{CM}$; power supplied from the power storage device 23 to the timer 24 is denoted by $P_{Tim}$; and a signal supplied from the timer 24 to the cache memory 22 to control the timing of refreshing is denoted by $S_{ref}$.

First, operation of the storage system in the case where power is supplied from the power supply 26 to the storage control circuit 12 will be described with reference to a timing chart in FIG. 3. Note that a signal and powers in the timing chart correspond to those illustrated in FIG. 2. Note that FN denotes the potential of the node FN described with reference to FIG. 1B, and indicates the retention of a potential based on data when FN is kept at a high level in FIG. 3.

Figure 3:
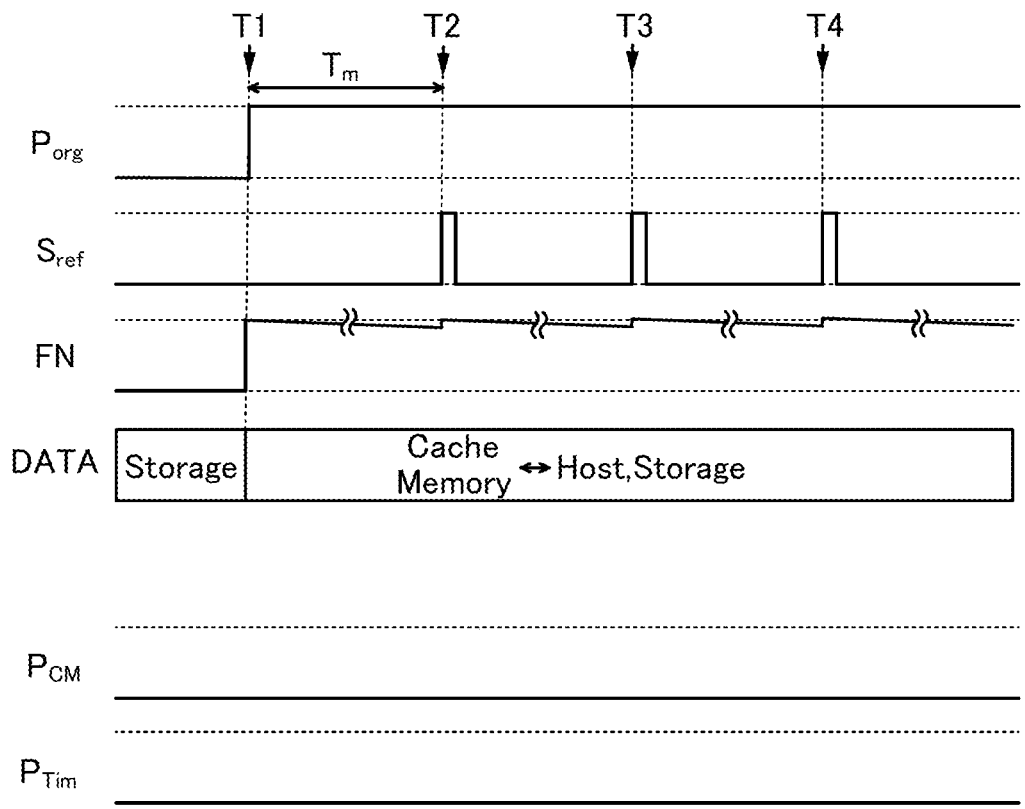
FIG. 3 is a timing chart illustrating one embodiment of the present invention.

At time T1 in the timing chart in FIG. 3, power is supplied from the power supply 26. In FIG. 3, a high level of $P_{org}$ means that power is supplied. The data DATA of the storage 13 is retained by the cache memory 22 and input and output between the storage 13 and the cache memory 22 or between the host 11 and the cache memory 22 by the access of the host 11. The node FN is set to the high level, which indicates the retention of a potential based on data. Note that power to be supplied from the power storage device 23 to the cache memory 22 and power to be supplied from the power storage device 23 to the timer 24 are not consumed because power is supplied from the power supply 26. Thus, $P_{CM}$ and $P_{Tim}$ are each set to a low level, which indicates that power is not supplied.

In some cases, the potential of the node FN may be lowered when there is no access between the host 11 and the cache memory 22 or between the storage 13 and the cache memory 22 for a certain period. Therefore, the timer 24 outputs the refresh signal $S_{ref}$ by utilizing power supplied from the power supply 26 to the storage control circuit 12, and refreshing is performed at regular intervals, e.g., at times T2 to T4, whereby data can be retained semi-permanently. Note that whether to perform refreshing or not may be determined such that refreshing is performed when a period $T_m$, the length of which is measured using the timer 24, exceeds the interval of refreshing $T_{refresh}$, which is set to, for example, 1 hour for refreshing at a frequency of once an hour.

Figure 4:
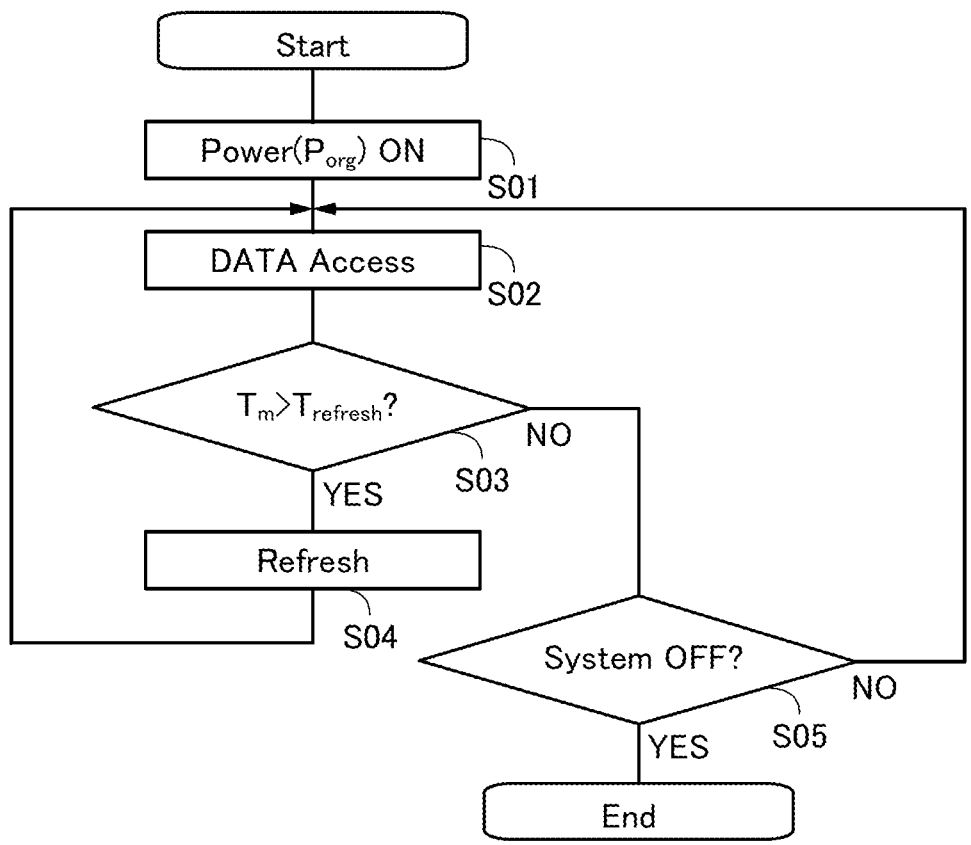
FIG. 4 is a flow chart illustrating one embodiment of the present invention.

The series of operations of the storage system illustrated in FIG. 3 will be described with reference to a flow chart in FIG. 4.

First, in Step S01, power supply from the power supply 26 to the storage control circuit 12 is started (Power ($P_{org}$) ON).

Next, in Step S02, data access between the host 11 and the cache memory 22 or between the storage 13 and the cache memory 22 is started (DATA Access).

Then, in Step S03, a determination is made on whether or not the period $T_m$ from the writing of data DATA to the node FN exceeds $T_{refresh}$, which corresponds to the interval of refreshing ($T_m>T_{refresh}$?). In the case where $T_m$ exceeds $T_{refresh}$, refreshing is performed in Step S04 (Refresh). In the case where $T_m$ does not exceed $T_{refresh}$, a determination in Step S05 is made.

Then, in Step S05, a determination is made on whether to shut down the storage system (System OFF?). In the case of not shutting down the storage system, Step S02 is performed again. In the case of shutting down the storage system, the data DATA of the cache memory 22 is stored in (or transferred to) the storage 13, for example, and the operations end.

Next, operation of the storage system in the case where power supply from the power supply 26 to the storage control circuit 12 is stopped and then restarted will be described with reference to a timing chart in FIG. 5. Note that a signal and powers in the timing chart correspond to those illustrated in FIG. 2. Note that FN denotes the potential of the node FN described with reference to FIG. 1B, and indicates the retention of a potential based on data when FN is kept at a high level in FIG. 5.

Figure 5:
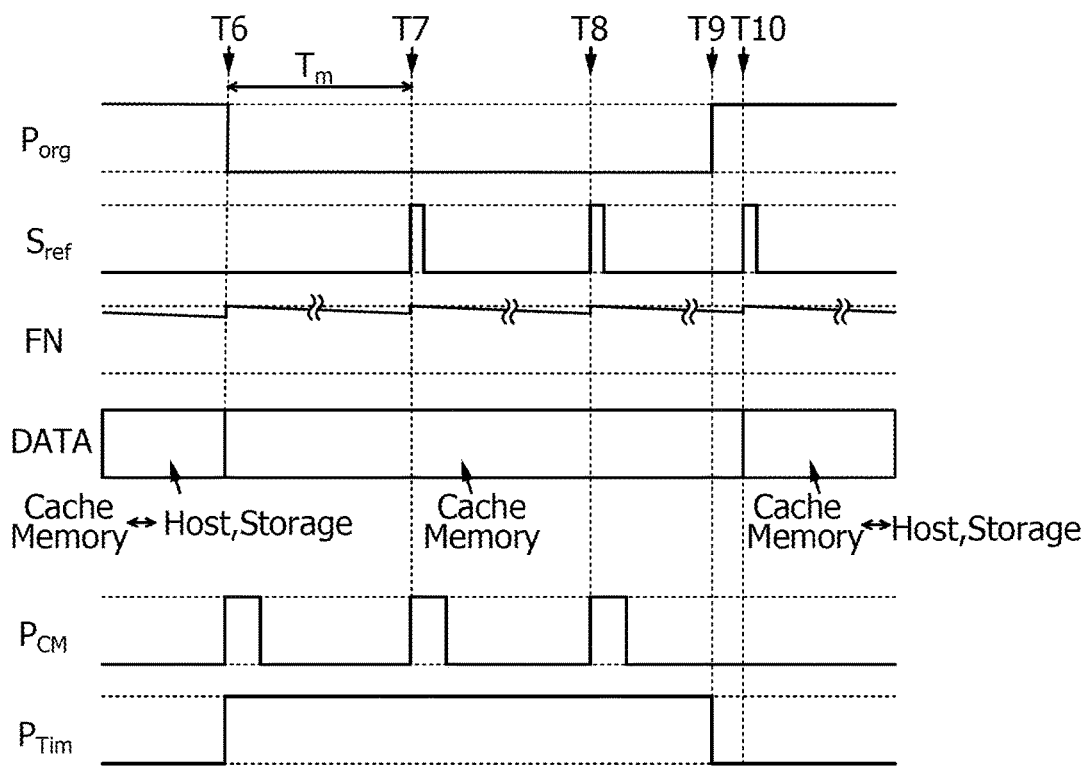
FIG. 5 is a timing chart illustrating one embodiment of the present invention.

At time T6 in the timing chart in FIG. 5, power supply from the power supply 26 to the storage control circuit 12 is stopped. A change of $P_{org}$ from a high level to a low level in FIG. 5 indicates the stop of power supply. Data access between the host 11 and the cache memory 22 or between the storage 13 and the cache memory 22 is stopped, and the data DATA is retained by the cache memory 22. Note that the data DATA of the cache memory 22 may be backed up by being stored in (or transferred to) the storage 13.

Although the potential based on data is retained at the node FN, the potential is lowered over time. Therefore, $P_{CM}$ and $P_{Tim}$ from the power storage device 23 are each set to a high level when power supply is stopped. In addition, the data DATA is refreshed and the timer 24 starts to count the period $T_m$. The data DATA in the cache memory 22 is refreshed intermittently; therefore, $P_{CM}$ is set to a low level after the refreshing is completed. Less power is consumed for the intermittent refreshing and the operation of the timer than for frequent refreshing.

In some cases, the potential of the node FN may be lowered when the data DATA is not refreshed for a certain period. Therefore, the timer 24 measures the period $T_m$ using the power $P_{Tim}$ of the power storage device 23, and outputs the refresh signal $S_{ref}$ such that refreshing is performed at regular intervals. In FIG. 5, refreshing is performed at regular intervals, e.g., at times T7 and T8, whereby data can be retained semi-permanently. In the case where the refreshing is performed, the power $P_{CM}$ is consumed regularly.

With reference to the timing chart in FIG. 5, operation for return from the state where power supply is stopped will be described. In this case, $P_{org}$ is raised to a high level (time T9). When $P_{org}$ is set to the high level, $P_{CM}$ and $P_{Tim}$ are each set to a low level. After refreshing is performed at time T10, data access between the host 11 and the cache memory 22 or between the storage 13 and the cache memory 22 is restarted.

The series of operations of the storage system illustrated in FIG. 5 in which power supply is stopped and then restarted will be described with reference to a flow chart in FIG. 6.

First, in Step S11, power supply is stopped (Power ($P_{org}$) OFF).

Next, in Step S12, power supply from the power storage device 23 to the cache memory 22 and the timer 24 is started (Power ($P_{CM}$, $P_{Tim}$) ON).

Then, in Step S13, data DATA is refreshed (Refresh). This refreshing is performed using the power $P_{CM}$ supplied from the power storage device 23.

Then, in Step S14, the timer 24 starts to measure the period $T_m$ (Timer Set). Note that Steps S12, S13, and S14 may be performed at the same time.

Then, in Step S15, the supply of the power $P_{CM}$ from the power storage device 23 is stopped (Power ($P_{CM}$) OFF) because refreshing has been performed in Step S13.

Then, in Step S16, a determination is made on whether or not the period $T_m$ from the refreshing of data DATA at the node FN exceeds $T_{refresh}$, which corresponds to the interval of refreshing ($T_m > T_{refresh}$?). In the case where $T_m$ exceeds $T_{refresh}$, refreshing is performed in Step S13 (Refresh). In the case where $T_m$ does not exceed $T_{refresh}$, a determination in Step S17 is made.

Then, in Step S17, a determination is made on whether to restart power supply from the power supply 26 to the storage system (Power ($P_{org}$) ON?). In the case of not restarting power supply, Step S16 is performed again. In the case of restarting power supply, Step S18 is performed.

Then, in Step S18, the supply of the power $P_{Tim}$ from the power storage device 23 is stopped (Power ($P_{Tim}$) OFF).

SUMMARY

As described above, the storage system with the configuration of this embodiment can retain data even when power supply is stopped. In addition, the storage system can reduce power required for data retention. In the storage system with the configuration of this embodiment, a memory cell including a transistor with low off-state current is used. By utilizing the low off-state current, data is retained and refreshed at a frequency of approximately once an hour, whereby data can be retained semi-permanently. In a period where power supply is stopped, data is retained using power which allows the transistor to be kept off, whereby power can be drastically reduced as compared with a configuration in which data is backed up.

Embodiment 2

In this embodiment, an example of a circuit configuration which can be applied to the memory cell included in the cache memory described above in Embodiment 1 will be described.

<Circuit Configuration Obtained by Combining OS Transistor with Capacitor>

Figure 7A:
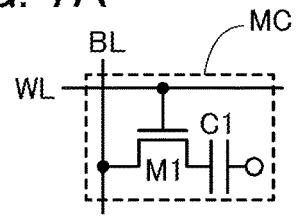
FIGS. 7A and 7B are circuit diagrams illustrating one embodiment of the present invention.

A memory cell MC illustrated in a circuit diagram in FIG. 7A includes a transistor M1 and a capacitor C1. The transistor M1 is constituted by, for example, an OS transistor with significantly low off-state current. The memory cell MC is operated using a bit line BL and a word line WL. Note that a plurality of memory cells MC are provided in a matrix, for example.

The write operation and read operation of the memory cell MC are basically the same as those of a dynamic random access memory (DRAM). That is, data is supplied to the bit line BL and written to the memory cell MC selected using the word line WL. Data is read to the bit line BL from the memory cell MC selected using the word line WL.

As described above, the off-state current of the transistor M1 is significantly low. Therefore, when the transistor M1 is off, a charge corresponding to data which has been retained by the capacitor C1 can continue to be retained. Accordingly, unlike in a DRAM memory cell including a Si transistor, the interval between refreshes can be extended. Consequently, the power consumption of a semiconductor device can be reduced.

Figure 7B:
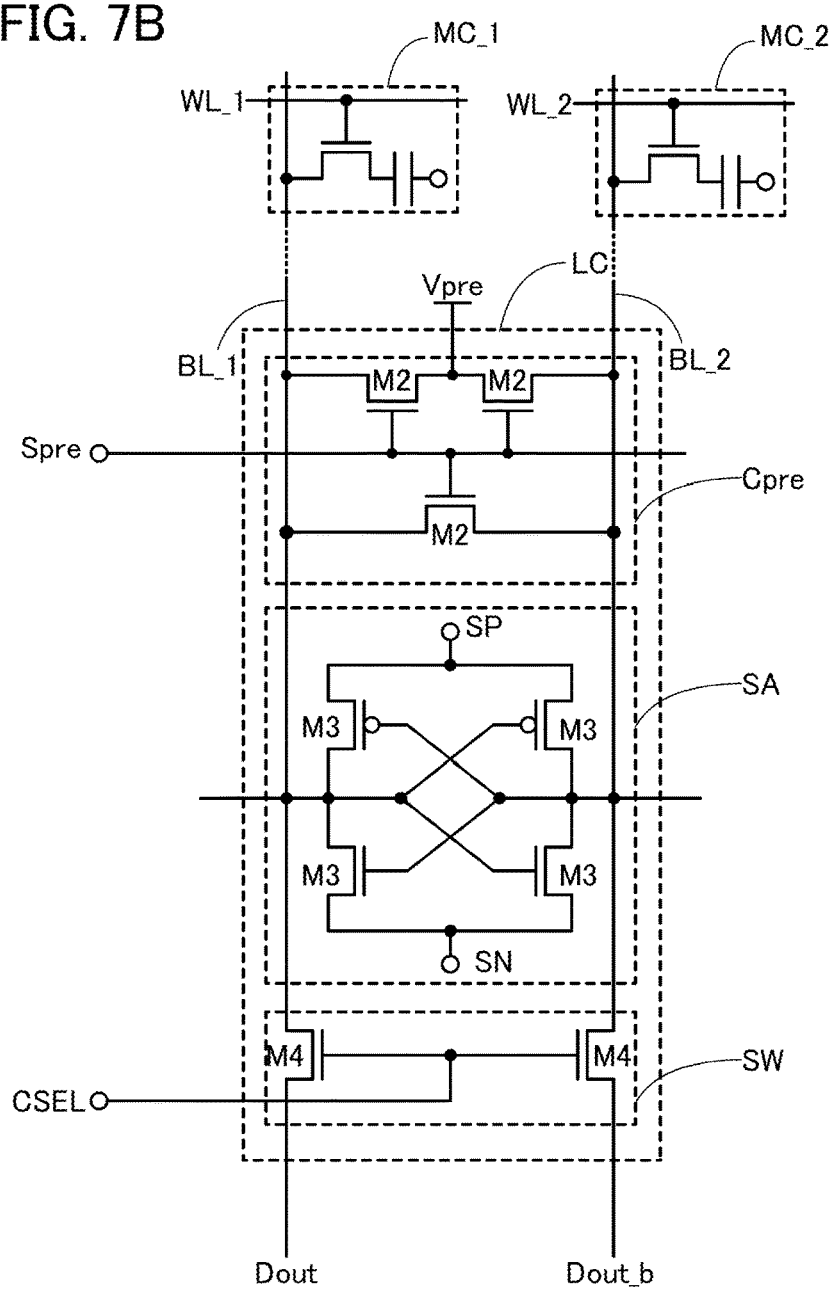

FIG. 7B illustrates a configuration of a peripheral circuit of the memory cell MC.

FIG. 7B illustrates a precharge circuit Cpre, a sense amplifier SA, and a switch SW as the peripheral circuit of the memory cell MC. FIG. 7B illustrates a memory cell MC_1 connected to a bit line BL_1 and a memory cell MC_2 connected to a bit line BL_2. The bit line BL_1 and the bit line BL_2 each correspond to the bit line BL in FIG. 7A. The memory cell MC_1 and the memory cell MC_2 each correspond to the memory cell MC in FIG. 7A.

The precharge circuit Cpre includes a plurality of transistors M2. The precharge circuit Cpre precharges the bit lines BL_1 and BL_2 to a precharge potential Vpre so that the bit lines BL_1 and BL_2 have an equal potential. The precharge circuit Cpre is controlled by a precharge signal Spre.

The sense amplifier SA includes a plurality of transistors M3. The sense amplifier SA amplifies a potential difference between the bit lines BL_1 and BL_2. The sense amplifier SA amplifies the potential difference between the bit lines BL_1 and BL_2 with potentials SP and SN.

The switch SW includes a plurality of transistors M4. Under the control of a signal CSEL, the switch SW outputs the potential difference between the bit lines BL_1 and BL_2 which has been amplified by the sense amplifier SA to a read circuit as data Dout and Dout_b.

The transistors M2, M3, and M4 are constituted by Si transistors. Si transistors have a higher field-effect mobility than OS transistors. Therefore, each circuit of the precharge circuit Cpre, the sense amplifier SA, and the switch SW can have favorable switching characteristics.

<Circuit Configuration Obtained by Combining OS Transistor with Si Transistor>

Figure 8A:
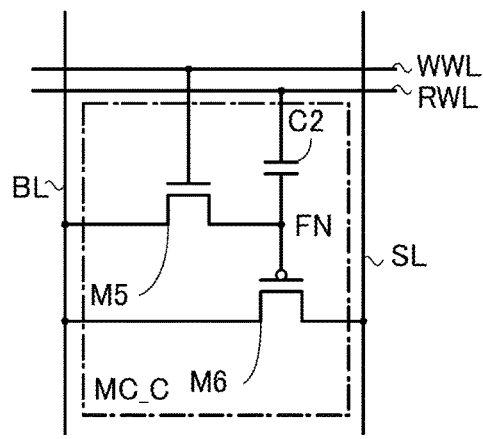
FIGS. 8A to 8F are circuit diagrams each illustrating one embodiment of the present invention.

A memory cell MC_C illustrated in a circuit diagram in FIG. 8A includes a transistor M5, a capacitor C2, and a transistor M6. The transistor M5 is constituted by, for example, an OS transistor with significantly low off-state current. The transistor M6 is constituted by a transistor containing silicon in a channel formation region (a Si transistor). The memory cell MC_C is operated using a bit line BL, a write word line WWL, a read word line RWL, and a source line SL. Note that a plurality of memory cells MC_C are provided in a matrix, for example.

In the write operation of the memory cell MC_C, the write word line WWL is controlled to turn on the transistor M5. Then, data supplied to the bit line BL is supplied to a node FN. In order to retain a charge based on the data supplied to the node FN, the write word line WWL is controlled to turn off the transistor M5.

The read operation of the memory cell MC_C is performed by controlling the read word line RWL with the transistor M5 off. Since the node FN is in an electrically floating state, the potential of the node FN changes in accordance with a change of the read word line RWL. This change allows the transistor M6 to be brought into a different conduction state depending on the data supplied to the node FN. In accordance with the change in the conduction state of the transistor M6, current flows between the bit line BL and the source line and the potential of the bit line BL changes; thus, data can be read.

As described above, the off-state current of the transistor M5 is significantly low. Therefore, when the transistor M5 is off, a charge corresponding to data which has been retained by the capacitor C2 can continue to be retained. Unlike a DRAM memory cell including a Si transistor, the memory cell MC_C maintains data even after the data is read. Accordingly, the memory cell MC_C can function as a nonvolatile memory cell when the transistor M5 is kept off.

The transistor M6 is constituted by a Si transistor. A Si transistor has a higher field-effect mobility than an OS transistor. Therefore, the amount of current which flows between the bit line BL and the source line SL in accordance with the potential of the node FN can be increased, and the potential of the bit line can be changed at high speed in the data read operation.

Next, a circuit configuration different from that of the memory cell MC_C illustrated in FIG. 8A will be described.

Figure 8B:
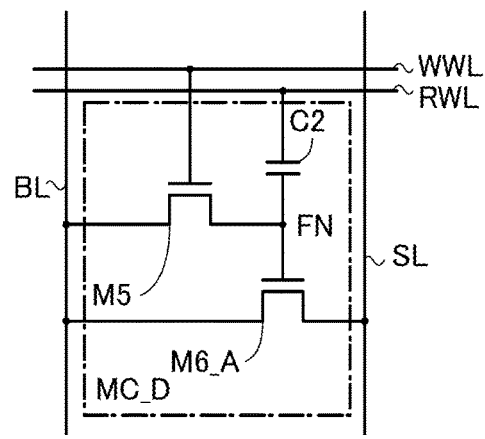

Although the memory cell MC_C illustrated in FIG. 8A includes a p-channel transistor as the transistor M6, another configuration may be employed. For example, as in a memory cell MC_D illustrated in FIG. 8B, a transistor M6_A which is an n-channel transistor may be included.

Figure 8C:
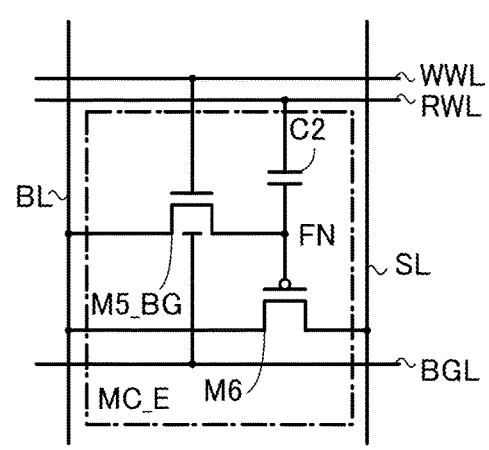

Although the transistor M5 in the memory cell MC_C illustrated in FIG. 8A is connected to the write word line WWL, another configuration may be employed. For example, as in a memory cell MC_E illustrated in FIG. 8C, a transistor M5_BG which additionally includes a back gate may be used and a potential may be supplied to the back gate through a wiring BGL. This enables control of the threshold voltage of the transistor M5_BG.

Although the current flow between the bit line BL and the source line SL is controlled by the transistor M6 in the memory cell MC_C illustrated in FIG. 8A, another configuration may be employed. For example, as in a memory cell MC_F illustrated in FIG. 8D, a plurality of transistors, e.g., a transistor M6_B and a transistor M6_C, may be provided between the bit line BL and the source line SL. This enables control of the current flow between the bit line BL and the source line SL without the operation of adjusting the potential of the node FN by capacitive coupling of the capacitor C2.

Figure 8D:
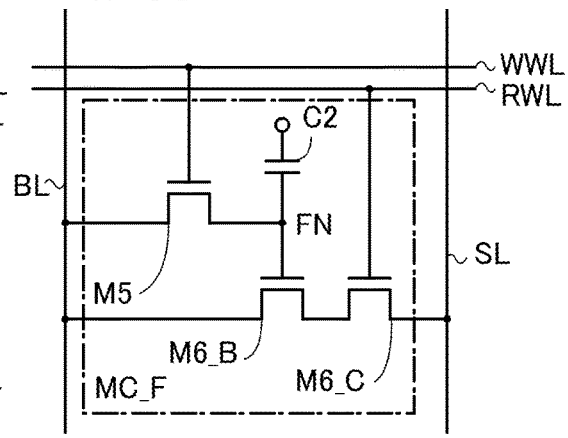
Figure 8E:
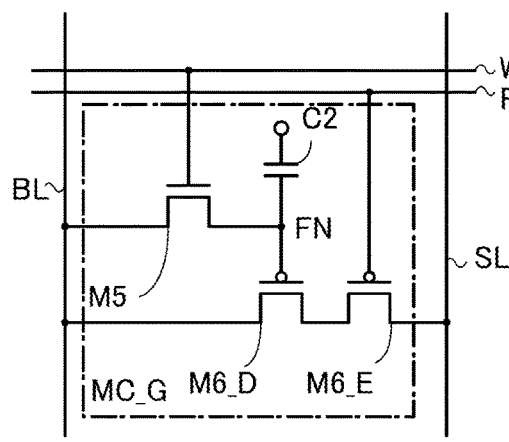

Although the transistor M6_B and the transistor M6_C in FIG. 8D are n-channel transistors, another configuration may be employed. For example, as in a memory cell MC_G illustrated in FIG. 8E, a transistor M6_D and a transistor M6_E provided between the bit line BL and the source line SL may be p-channel transistors.

Figure 8F:
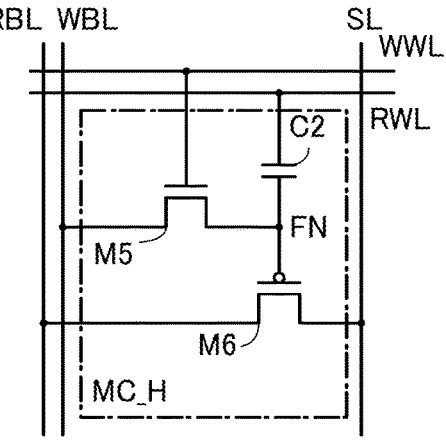

Although the memory cell MC_C illustrated in FIG. 8A uses the same bit line BL for data write operation and data read operation, another configuration may be employed. For example, as in a memory cell MC_H illustrated in FIG. 8F, a bit line WBL for writing data and a bit line RBL for reading data may be provided.

Figure 9:
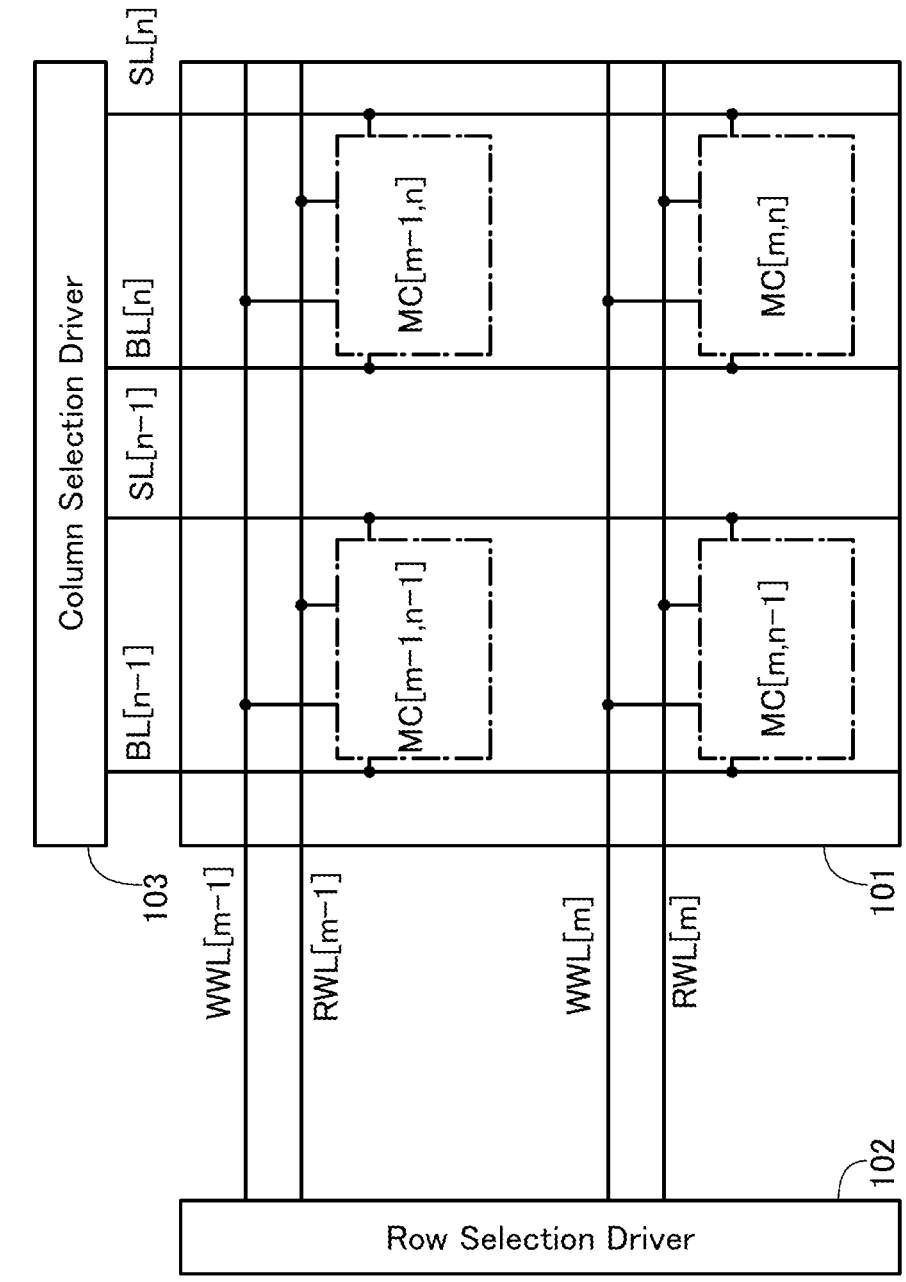
FIG. 9 is a circuit diagram illustrating one embodiment of the present invention.

FIG. 9 illustrates an example of a block diagram including a driver circuit for operating the memory cell MC_C illustrated in FIG. 8A (hereinafter also referred to as a memory cell MC). Note that memory cells are provided in m rows and n columns (m and n are each a natural number of 2 or more), and FIG. 9 illustrates memory cells in (m−1)-th and m-th rows and (n−1)-th and n-th columns.

A block diagram in FIG. 9 illustrates a memory cell array 101 in which the plurality of memory cells MC arranged in m rows and n columns are provided (indicated as MC[m,n] in the diagram), a row selection driver 102, and a column selection driver 103. In addition, FIG. 9 illustrates a write word line WWL[m−1], a read word line RWL[m−1], a write word line WWL[m], a read word line RWL[m], a bit line BL[n−1], a bit line BL[n], a source line SL[n−1], and a source line SL[n] as write word lines WWL, read word lines RWL, bit lines BL, and source lines SL.

The row selection driver 102 is a circuit that outputs a signal for selecting the memory cell MC in each row. The column selection driver 103 is a circuit that outputs a signal for writing a data voltage to the memory cell MC and reading the data voltage from the memory cell MC. The row selection driver 102 and the column selection driver 103 include circuits such as a decoder and can output a signal or a data voltage to each row and each column.

<Circuit Configuration Based on SRAM and Combined with OS Transistor>

Figure 10A:
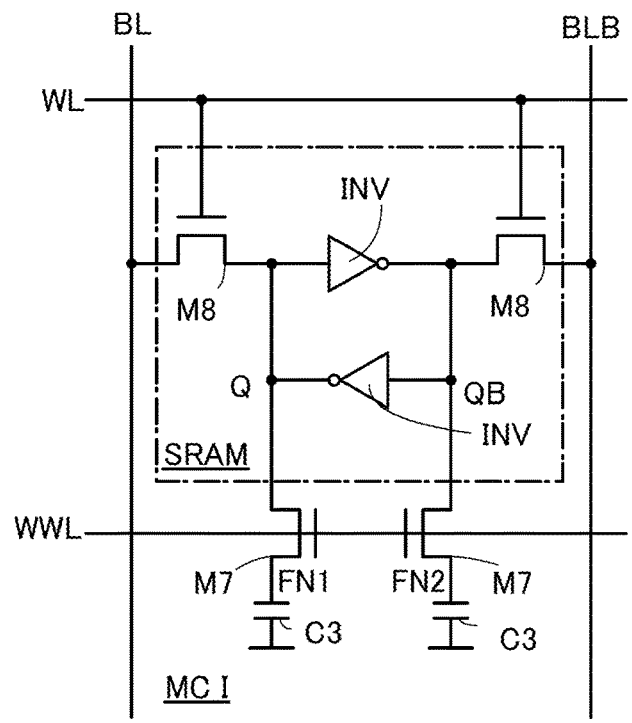
FIGS. 10A and 10B are circuit diagrams each illustrating one embodiment of the present invention.

A memory cell MCI illustrated in FIG. 10A includes an SRAM, transistors M7, and capacitors C3. The SRAM includes transistors M8 and inverter circuits INV. The memory cell MC_I backs up data of nodes Q and QB of the SRAM to nodes FN1 and FN2 under the control of a signal supplied to a wiring WWL and controls recovery of the data from the nodes FN1 and FN2 to the nodes Q and QB. Turning off the transistors M7 allows a charge based on data to be retained at the nodes FN1 and FN2.

Figure 10B:
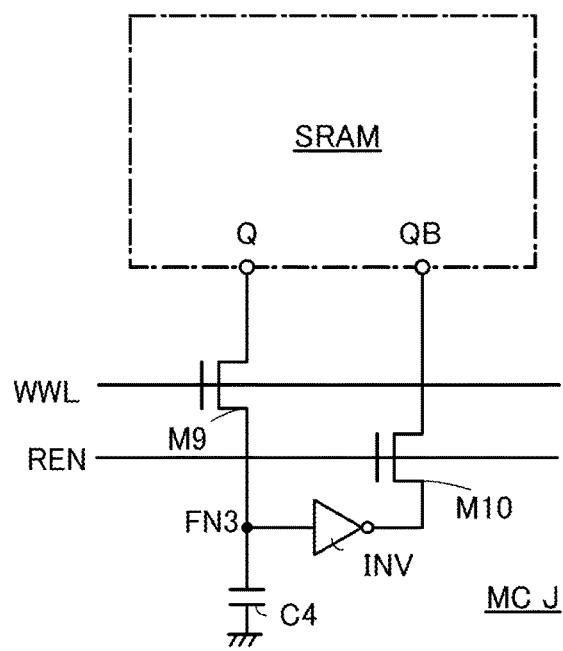

A memory cell MC_J illustrated in FIG. 10B includes an SRAM, a transistor M9, an inverter circuit INV, a capacitor C4, and a transistor M10. The memory cell MC_J backs up data of a node Q or QB of the SRAM to a node FN3 under the control of signals supplied to a wiring WWL and a wiring REN and controls recovery of the data from the node FN3 to the node Q or QB. Turning off the transistor M9 allows a charge based on data to be retained at the node FN3.

Each of the above-described examples of the memory cell of the cache memory of the storage system can employ the configuration described in the above embodiment. Accordingly, a storage system with reduced power consumption can be achieved.

Embodiment 3

In this embodiment, cross-sectional structures of the transistors included in the memory cells described in Embodiment 2 will be described with reference to drawings. In this embodiment, a layer including Si transistors and a layer including OS transistors will be described as the transistors. In addition, an oxide semiconductor contained in OS transistors will be described in detail. A structural example in which the layer including OS transistors and the layer including Si transistors are stacked will be described.

<Cross-Sectional Structure of Layer Including Si Transistors>

Figure 11A:
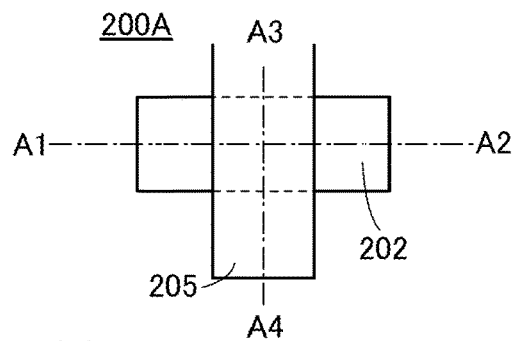
FIGS. 11A to 11C are a top view and schematic cross-sectional views illustrating one embodiment of the present invention.

FIG. 11A is a top view illustrating an example of a transistor in the layer including Si transistors. FIG. 11A illustrates a transistor 200A.

Figure 11B:
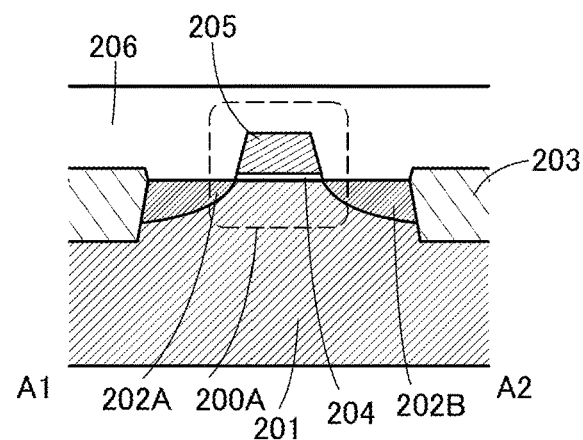

FIG. 11B is a schematic cross-sectional view of the transistor 200A taken along dashed line A1-A2 in FIG. 11A. Note that the cross section along dashed line A1-A2 illustrates a structure of the transistor 200A in the channel length direction.

Figure 11C:
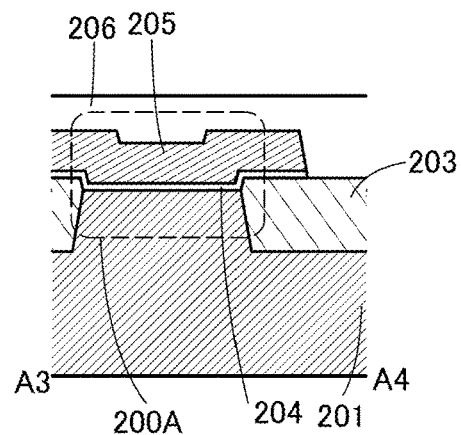

FIG. 11C is a schematic cross-sectional view of the transistor 200A taken along dashed line A3-A4 in FIG. 11A. Note that the cross section along dashed line A3-A4 illustrates a structure of the transistor 200A in the channel width direction.

FIG. 11A illustrates the layout of a semiconductor layer 202 and a gate electrode 205 of the transistor 200A. In the semiconductor layer 202, a channel formation region is formed in a region overlapping with the gate electrode, and impurity regions are formed in regions surrounded by an element isolation layer. Note that the transistor 200A is a p-channel transistor in the following description.

FIG. 11B illustrates a substrate 201, impurity regions 202A and 202B, an element isolation region 203, a gate insulating layer 204, the gate electrode 205, and an interlayer insulating layer 206.

FIG. 11C illustrates the substrate 201, the element isolation region 203, the gate insulating layer 204, the gate electrode 205, and the interlayer insulating layer 206.

The substrate 201 can be, for example, a silicon substrate, a germanium substrate, or a silicon germanium substrate. In FIGS. 11A to 11C, a single crystal silicon substrate is used as the substrate 200. Note that the substrate 201 is, for example, a semiconductor substrate including impurities imparting n-type conductivity. The substrate 201 may be a semiconductor substrate including impurities imparting p-type conductivity. In that case, a well including impurities imparting n-type conductivity is provided in a region where the transistor 200A is formed.

The impurity regions 202A and 202B have functions of a source region and a drain region. The impurity regions 202A and 202B are, for example, regions including impurities imparting p-type conductivity.

The element isolation region 203 is a region for electrically isolating adjacent transistors from each other. The element isolation region 203 can be formed by a trench isolation method (a shallow trench isolation (STI) method) or the like. The trench isolation method is a method for electrically isolating transistors by element isolation using an element isolation region formed in such a manner that an insulator including silicon oxide or the like is buried in a trench formed in a substrate by etching or the like and then the insulator is removed partly by etching or the like.

As the gate insulating layer 204, a single-layer structure or a stacked-layer structure of a thermal oxide film, a silicon oxide film, a silicon nitride film, a silicon oxynitride film, or the like can be used.

For the gate electrode 205, polycrystalline silicon to which phosphorus is added can be used. Other than polycrystalline silicon, silicide, which is a compound of a metal and silicon, may be used.

It is preferable that the interlayer insulating layer 206 have a low dielectric constant and a sufficient thickness. For example, a silicon oxide film having a dielectric constant of approximately 3.8 may be used.

Figure 12A:
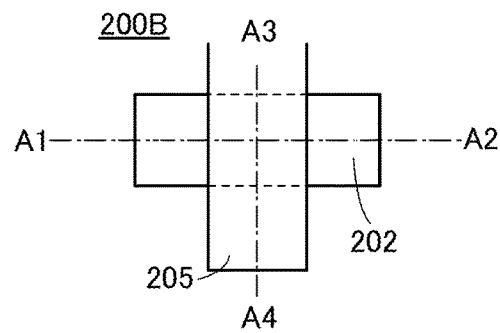
FIGS. 12A to 12C are a top view and schematic cross-sectional views illustrating one embodiment of the present invention.
Figure 12B:
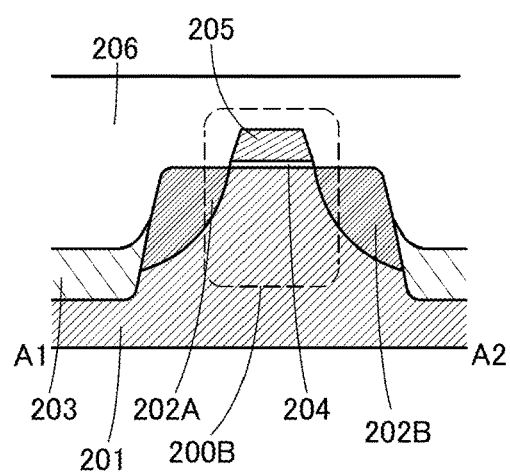
Figure 12C:
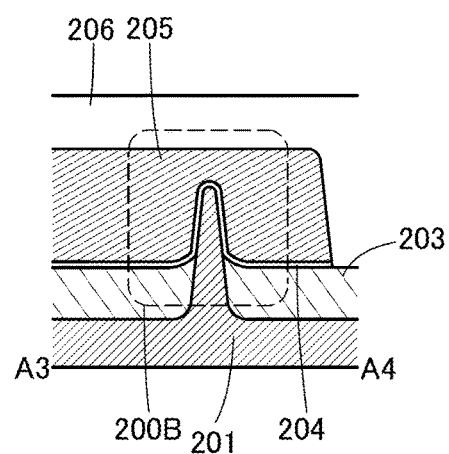

FIGS. 12A to 12C illustrate a structure different from that of the transistor in the layer including Si transistors which is illustrated in FIGS. 11A to 11C. FIGS. 12A to 12C illustrate a case where a transistor 200B is a FIN-type transistor which is a modification example of the transistor 200A illustrated in FIGS. 11A to 11C. The effective channel width is increased in the FIN-type transistor 200B, whereby the on-state characteristics of the transistor 200B can be improved. In addition, since contribution of the electric field of the gate electrode can be increased, the off-state characteristics of the transistor 200B can be improved.

Figure 13A:
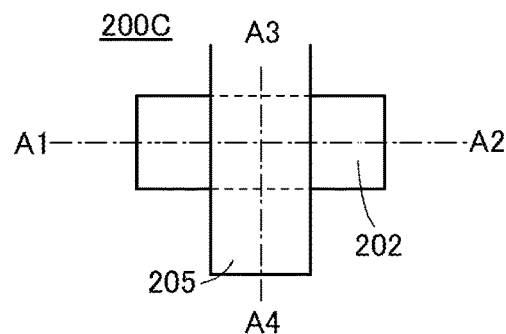
FIGS. 13A to 13C are a top view and schematic cross-sectional views illustrating one embodiment of the present invention.
Figure 13B:
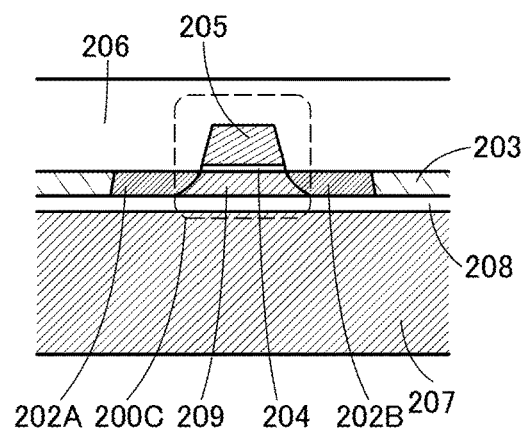
Figure 13C:
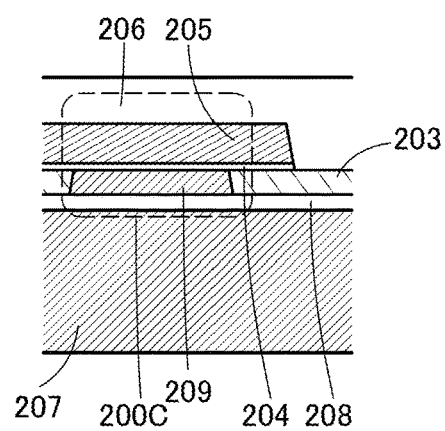

FIGS. 13A to 13C illustrate a structure different from that of the transistor in the layer including Si transistors which is illustrated in FIGS. 11A to 11C or FIGS. 12A to 12C. FIGS. 13A to 13C illustrate a case where a transistor 200C is provided on a substrate 207 which is an SOI substrate. FIGS. 13A to 13C illustrate a structure in which a region 209 is separated from the substrate 207 by an insulating layer 208. Since the SOI substrate is used as the substrate 207, a punch-through phenomenon and the like can be suppressed; thus, the off-state characteristics of the transistor 200C can be improved. Note that the insulating layer 208 can be formed by turning a portion of the substrate 207 into an insulating layer. For example, silicon oxide can be used for the insulating layer 208.

<Cross-Sectional Structure of Layer Including OS Transistors>

Figure 14A:
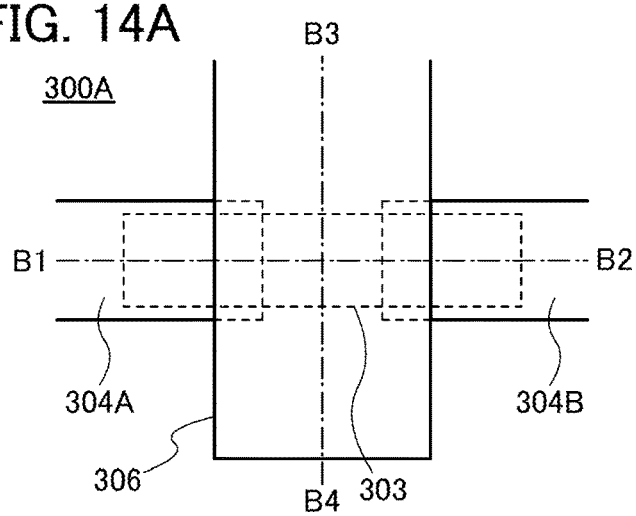
FIGS. 14A to 14C are a top view and schematic cross-sectional views illustrating one embodiment of the present invention.

FIG. 14A is a top view illustrating an example of a transistor in the layer including OS transistors. FIG. 14A illustrates a transistor 300A.

Figure 14B:
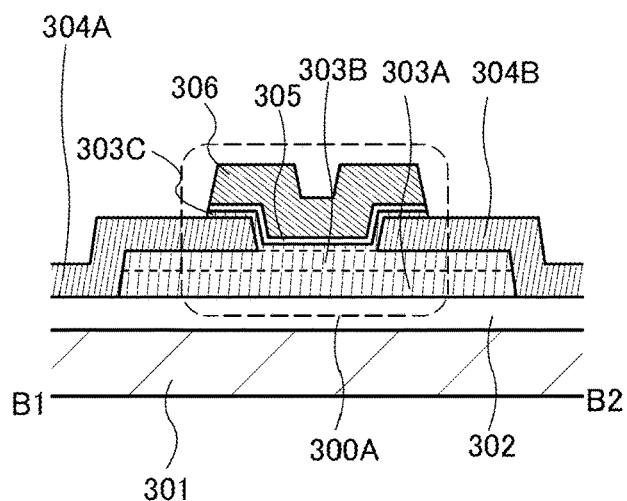

FIG. 14B is a schematic cross-sectional view of the transistor 300A taken along dashed line B1-B2 in FIG. 14A. Note that the cross section along dashed line B1-B2 illustrates a structure of the transistor 300A in the channel length direction.

Figure 14C:
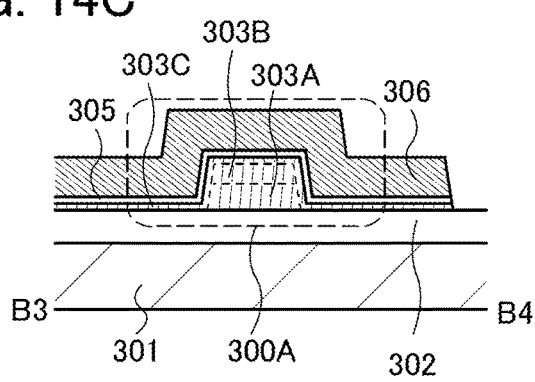

FIG. 14C is a schematic cross-sectional view of the transistor 300A taken along dashed line B3-B4 in FIG. 14A. Note that the cross section along dashed line B3-B4 illustrates a structure of the transistor 300A in the channel width direction.

FIG. 14A illustrates the layout of an oxide semiconductor layer 303, wirings 304A and 304B in contact with the oxide semiconductor layer 303, and a gate electrode 306 of the transistor 300A. In the oxide semiconductor layer 303, two oxide semiconductor layers 303A and 303B are stacked. In addition, an oxide semiconductor layer 303C is stacked thereover and under the gate electrode 306. The oxide semiconductor layers 303A to 303C contain oxide semiconductors which differ in the atomic ratio of metal elements. Note that the oxide semiconductor layers 303A and 303C may each have a function of an insulating layer in some cases. Therefore, the oxide semiconductor layers 303A and 303C may each be referred to as an oxide layer or an insulating layer in some cases.

FIG. 14B illustrates an interlayer insulating layer 301, an insulating layer 302, the oxide semiconductor layers 303A to 303C, the wirings 304A and 304B, a gate insulating layer 305, and the gate electrode 306.

FIG. 14C illustrates the interlayer insulating layer 301, the insulating layer 302, the oxide semiconductor layers 303A to 303C, the gate insulating layer 305, and the gate electrode 306.

The interlayer insulating layer 301 is in contact with an insulating layer under the transistor 300A. A conductive layer serving as a wiring may be buried therein.

The insulating layer 302 has a blocking effect of preventing diffusion of oxygen, hydrogen, and water. As the insulating layer 302 has higher density and becomes denser or has fewer dangling bonds and becomes more chemically stable, the insulating layer 302 has a higher blocking effect. The insulating layer 302 that has the blocking effect of preventing diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating layer 302 having the blocking effect of preventing diffusion of hydrogen and water can be formed using, for example, silicon nitride or silicon nitride oxide.

The oxide semiconductor layers 303A to 303C contain oxide semiconductors which differ in the atomic ratio of metal elements. Oxide semiconductors will be described later in detail.

The gate insulating layer 305 preferably has a function of supplying part of oxygen to the oxide semiconductor layers 303A to 303C by heating. It is preferable that the number of defects in the gate insulating layer 305 be small, and typically the spin density at g=2.001 due to a dangling bond of silicon be lower than or equal to $1 \times 10^{18}$ spins/cm$^3$. The spin density is measured by electron spin resonance (ESR) spectroscopy.

The gate insulating layer 305, which has a function of supplying part of oxygen to the oxide semiconductor layers 303A to 303C by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The gate insulating layer 305 can be formed by a plasma CVD (chemical vapor deposition) method, a sputtering method, or the like.

Note that in this specification, oxynitride contains more oxygen than nitrogen, and nitride oxide contains more nitrogen than oxygen.

The gate electrode 306 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, platinum, strontium, iridium, and tungsten. For example, an alloy or a compound may be used, and a conductor containing aluminum, a conductor containing copper and titanium, a conductor containing copper and manganese, a conductor containing indium, tin, and oxygen, a conductor containing titanium and nitrogen, or the like may be used.

As in the transistor 300A illustrated in FIGS. 14A to 14C, the oxide semiconductor layer 303B can be electrically surrounded by an electric field of the gate electrode 306 (a transistor structure in which a semiconductor is electrically surrounded by an electric field of a conductor is referred to as a surrounded channel (s-channel) structure). Therefore, a channel is formed in the entire oxide semiconductor layer 303B (the top and side surfaces). In the s-channel structure, a large amount of current can flow between a source and a drain of the transistor, so that a high on-state current can be achieved.

Figure 15A:
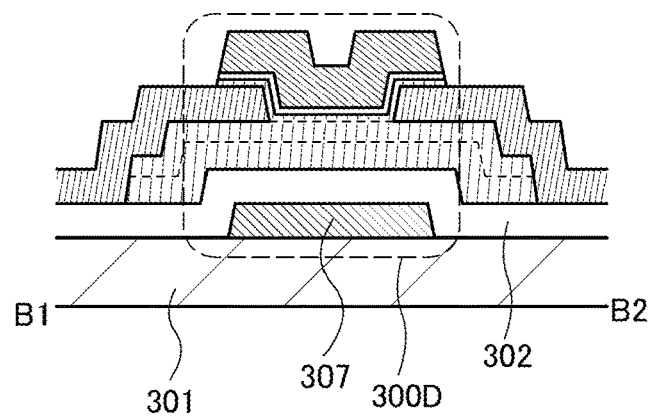
FIGS. 15A to 15C are schematic cross-sectional views each illustrating one embodiment of the present invention.
Figure 15B:
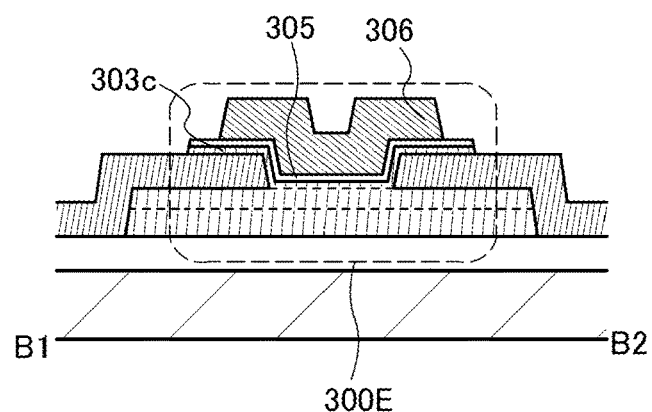

Note that as in a transistor 300D illustrated in FIG. 15A, a back gate electrode 307 may be provided between the interlayer insulating layer 301 and the insulating layer 302. As in a transistor 300E illustrated in FIG. 15B, the gate insulating layer 305 and the oxide semiconductor layer 303C may extend beyond the gate electrode 306. As in a transistor 300F illustrated in FIG. 15C, the oxide semiconductor layers 303A and 303B and the wirings 304A and 304B may be covered with the gate insulating layer 305 and the oxide semiconductor layer 303C (see FIG. 15C).

Figure 16A:
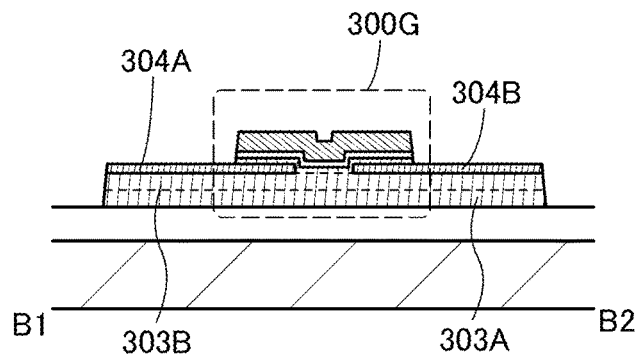
FIGS. 16A to 16C are schematic cross-sectional views each illustrating one embodiment of the present invention.
Figure 16B:
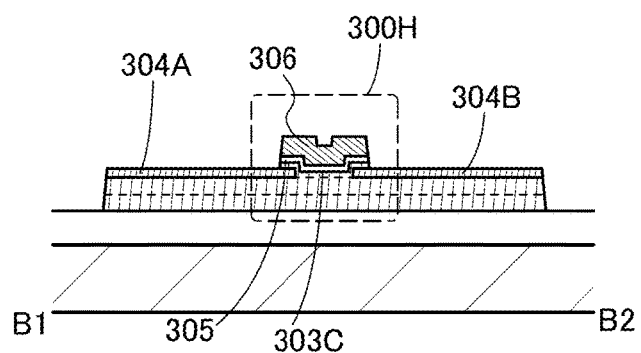
Figure 16C:
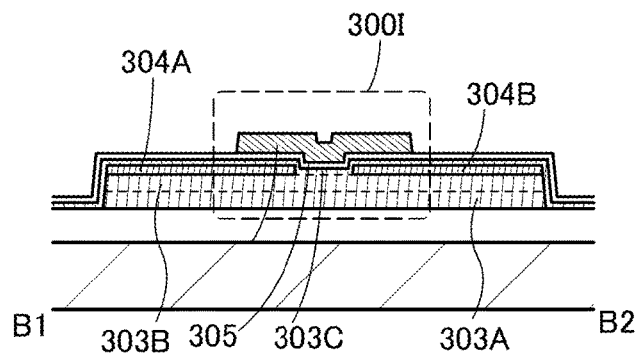

As in a transistor 300G illustrated in FIG. 16A, the edge portion of the wirings 304A and 304B in the B1-B2 cross section may be aligned with that of the oxide semiconductor layers 303A and 303B. As in a transistor 300H illustrated in FIG. 16B, the gate electrode 306, the gate insulating layer 305, and the oxide semiconductor layer 303C may overlap with the wirings 304A and 304B in small regions. As in a transistor 300I illustrated in FIG. 16C, top and side surfaces of the oxide semiconductor layers 303A and 303B and the wirings 304A and 304B may be covered with the gate insulating layer 305 and the oxide semiconductor layer 303C.

Figure 17A:
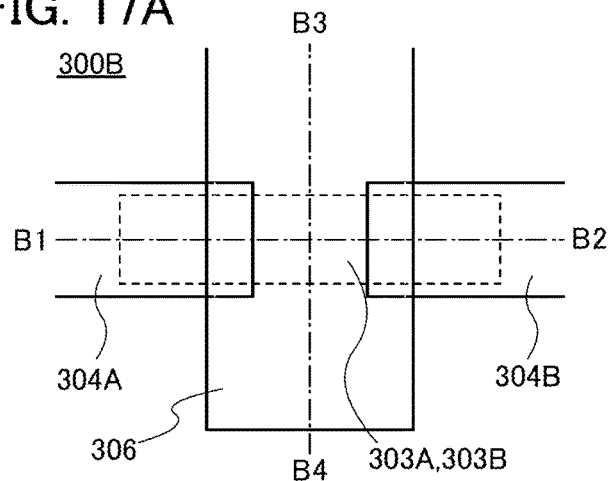
FIGS. 17A to 17C are a top view and schematic cross-sectional views illustrating one embodiment of the present invention.
Figure 17B:
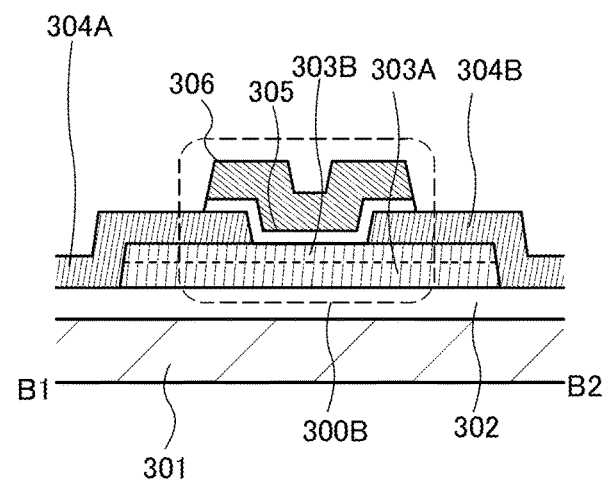
Figure 17C:
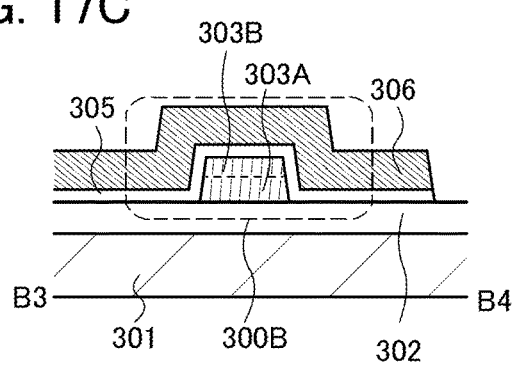

As in a transistor 300B illustrated in FIGS. 17A to 17C, the oxide semiconductor layer 303C may be omitted. FIG. 17A is an example of a top view. FIG. 17B is a schematic cross-sectional view of the transistor 300B taken along dashed line B1-B2 in FIG. 17A. FIG. 17C is a schematic cross-sectional view of the transistor 300B taken along dashed line B3-B4 in FIG. 17A.

<Cross-Sectional Structure of Stack Including Layer Including Si Transistors and Layer Including OS Transistors>

Figure 18:
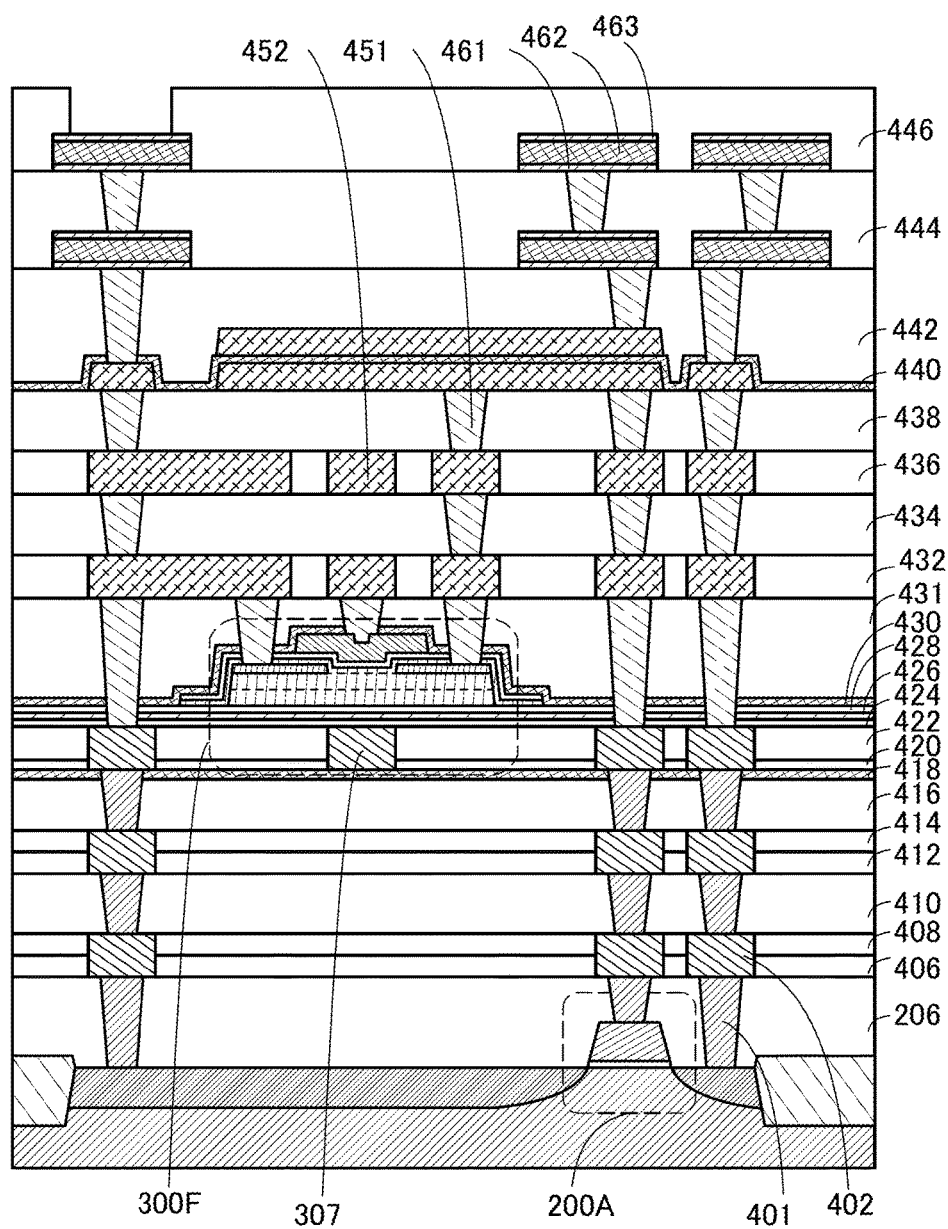
FIG. 18 is a schematic cross-sectional view illustrating one embodiment of the present invention.

FIG. 18 illustrates an example of a cross-sectional structure in which the layer including Si transistors described with any of FIGS. 11A to 13C and the layer including OS transistors described with any of FIGS. 14A to 17C are stacked.

Figure 15C:
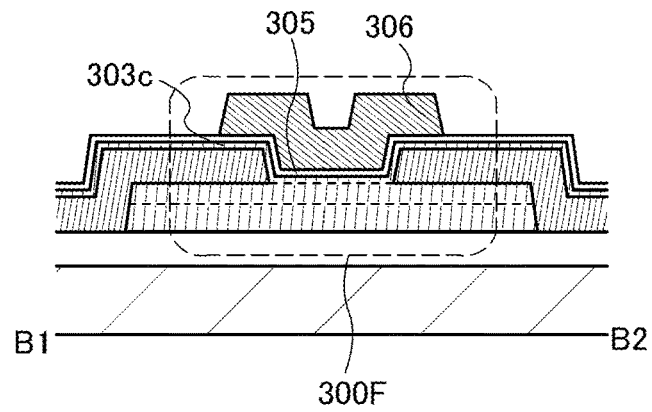

FIG. 18 is an example of a schematic cross-sectional view in which the transistor 200A illustrated in FIG. 11A and the transistor 300F illustrated in FIG. 15C are stacked.

The schematic cross-sectional view in FIG. 18 illustrates wirings 401 and 402, insulating layers 406, 408, 410, 412, 414, 416, 418, 420, 422, 424, 426, 428, 430, 431, 432, 434, 436, 438, 440, 442, 444, and 446, and wirings 451, 452, 461, 462, and 463.

Note that the transistor 300F includes, as the back gate electrode 307, a wiring provided in an opening in the insulating layers 420 and 422. Including the back gate electrode, the transistor can have stable electrical characteristics.

The insulating layer 406 is located over the interlayer insulating layer 206. The insulating layer 408 is located over the insulating layer 406. The insulating layer 410 is located over the insulating layer 408. The insulating layer 412 is located over the insulating layer 410. The insulating layer 414 is located over the insulating layer 412. The insulating layer 416 is located over the insulating layer 414. The insulating layer 418 is located over the insulating layer 416. The insulating layer 420 is located over the insulating layer 418. The insulating layer 422 is located over the insulating layer 420. The insulating layer 424 is located over the insulating layer 422. The insulating layer 426 is located over the insulating layer 424. The insulating layer 428 is located over the insulating layer 426. The transistor 300F is located over the insulating layer 418.

The wirings 401 and 402 are buried in openings provided in the interlayer insulating layer 206, the insulating layers 406, 408, 410, 412, 414, 416, 418, 420, and 422.

The insulating layer 430 is located over the transistor 300F and the insulating layer 428. The insulating layer 431 is located over the insulating layer 430. The insulating layer 432 is located over the insulating layer 430. The insulating layer 434 is located over the insulating layer 432. The insulating layer 436 is located over the insulating layer 434. The insulating layer 438 is located over the insulating layer 436. The insulating layer 440 is located over the insulating layer 438. The insulating layer 442 is located over the insulating layer 440. The insulating layer 444 is located over the insulating layer 442. The insulating layer 446 is located over the insulating layer 444.

The wirings 451 and 452 are buried in openings provided in the insulating layers 424, 426, 428, 430, 431, 432, 434, 436, and 438. The wirings 451 and 452 are provided over the insulating layers 438 and 440. The wirings 461, 462, and 463 are provided over the insulating layers 442 and 444 and electrically connected through the wiring 451 buried in openings in the insulating layer 444. In the insulating layer 446, an opening is provided such that the wiring 463 is exposed.

The insulating layers 406, 408, 410, 412, 414, 416, 418, 420, 422, 424, 426, 428, 431, 432, 434, 436, 438, 442, 444, and 446 may each be formed to have, for example, a single-layer structure or a stacked-layer structure including an insulating layer containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulating layers 418, 430, and 440 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

At least one of the insulating layers 406, 408, 410, 412, 414, 416, 418, 420, 422, 424, 426, 428, 430, 431, 432, 434, 436, 438, 440, 442, 444, and 446 preferably has a function of blocking oxygen and impurities such as hydrogen. When an insulating layer that has a function of blocking oxygen and impurities such as hydrogen is placed near the transistor 300F, the electrical characteristics of the transistor 300F can be stable.

The insulating layer that has a function of blocking oxygen and impurities such as hydrogen may be formed to have a single-layer structure or a stacked-layer structure including an insulating layer containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The wirings 451 and 452 may be formed to have, for example, a single-layer structure or a stacked-layer structure including a conductor containing one or more kinds of molybdenum and tungsten. For example, an alloy or a compound may be used.

The wirings 401 and 402 may be formed to have, for example, a single-layer structure or a stacked-layer structure including a conductor containing one or more kinds of copper and aluminum. For example, an alloy or a compound may be used.

The wirings 461, 462, and 463 may be formed to have, for example, a single-layer structure or a stacked-layer structure including a conductor containing one or more kinds of copper and aluminum. For example, an alloy or a compound may be used.

The memory cell of the cache memory of the storage system which is one embodiment of the present invention can employ any of the cross-sectional structures of the transistors described in this embodiment.

Embodiment 4

In this embodiment, the OS transistor described in the above-described embodiment will be described.

<Off-State Current Characteristics>

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $8\times10^{11}/cm^3$, preferably lower than $1\times10^{11}/cm^3$, more preferably lower than $1\times10^{10}/cm^3$, and is higher than or equal to $1\times10^{-9}/cm^3$. In the oxide semiconductor, hydrogen, nitrogen, carbon, silicon, and metal elements that are not main components are impurities. For example, hydrogen and nitrogen form donor levels to increase the carrier density.

A transistor using an intrinsic or substantially intrinsic oxide semiconductor has a low carrier density and thus is less likely to have negative threshold voltage. In addition, because of few carrier traps in the oxide semiconductor, the transistor using the oxide semiconductor has small variation in electrical characteristics and has high reliability. Furthermore, the transistor using the oxide semiconductor achieves an ultralow off-state current.

Note that the OS transistor with reduced off-state current can exhibit a normalized off-state current per micrometer in channel width of $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C.

Figure 19:
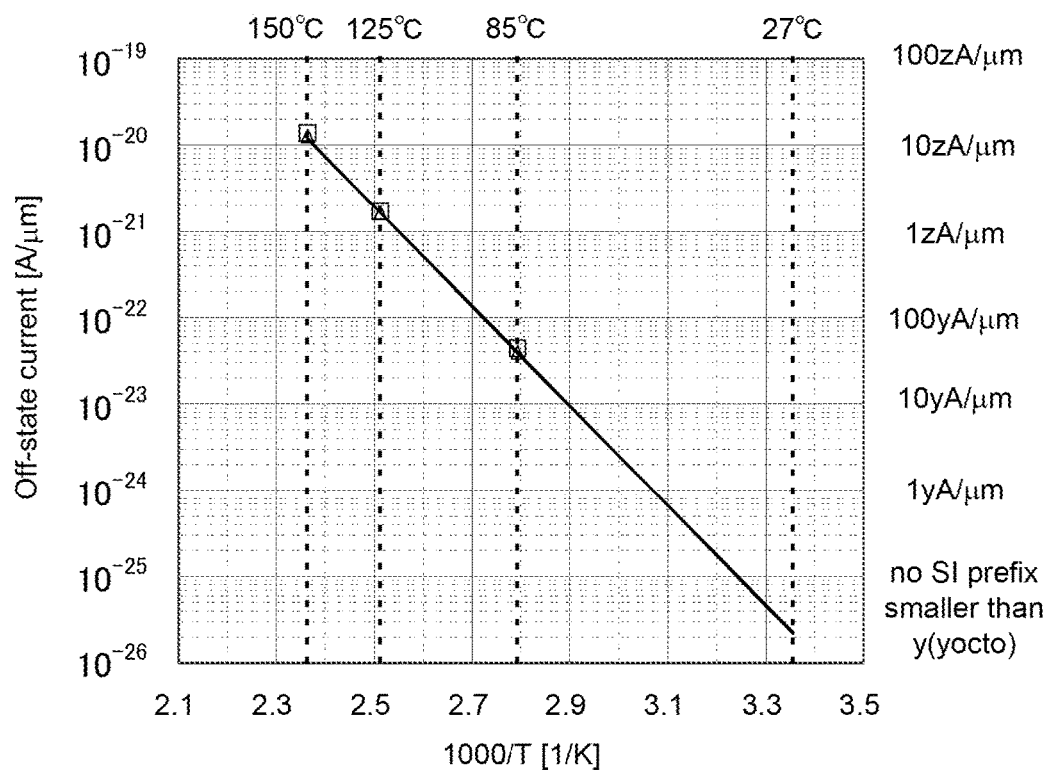
FIG. 19 is an Arrhenius plot diagram for describing one embodiment of the present invention.

In order to detect low off-state current due to the use of an intrinsic or substantially intrinsic oxide semiconductor, a relatively large transistor is fabricated to measure the off-state current, whereby an off-state current that actually flows can be estimated. FIG. 19 shows an Arrhenius plot of the off-state current per micrometer in channel width W of a large transistor having a channel width W of 1 m (1000000 μm) and a channel length L of 3 μm at the temperatures of 150° C., 125° C., 85° C., and 27° C. As shown in FIG. 19, it is found that the off-state current is as extremely low as $3\times10^{-26}$ A/μm. The reason the off-state current is measured at elevated temperature is that a very low current at room temperature cannot be measured.

<Off-State Current>

Unless otherwise specified, the off-state current in this specification refers to a drain current of a transistor in the off state (also referred to as non-conduction state and cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. For this reason, when there is $V_{gs}$ at which the off-state current of a transistor is lower than or equal to I, it may be said that the off-state current of the transistor is lower than or equal to I. The off-state current of a transistor may refer to off-state current at given $V_{gs}$, off-state current at $V_{gs}$ in a given range, or off-state current at $V_{gs}$ at which sufficiently low off-state current is obtained.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value in relation to the channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is $V_{gs}$ at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on voltage $V_{ds}$ between its drain and source in some cases. Unless otherwise specified, the off-state current in this specification may be an off-state current at Vas with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vas at which the reliability of a semiconductor device or the like including the transistor is ensured or $V_{ds}$ used in the semiconductor device or the like. When there is $V_{gs}$ at which the off-state current of a transistor is lower than or equal to I at given $V_{ds}$, it may be said that the off-state current of the transistor is lower than or equal to I. Here, given Vas is, for example, 0.1 V, 0.8 V, 1 V, 1.2 V, 1.8 V, 2.5 V, 3 V, 3.3 V, 10 V, 12 V, 16 V, 20 V, Vas at which the reliability of a semiconductor device or the like including the transistor is ensured, or $V_{ds}$ used in the semiconductor device or the like.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

<Composition of Oxide Semiconductor>

Note that at least indium (In) or zinc (Zn) is preferably contained in an oxide semiconductor used for the semiconductor layer of the OS transistor. In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, it is possible to use an In—Ga—Zn-based oxide with an atomic ratio of In:Ga:Zn=1:1:1, 3:1:2, 4:2:3, or 2:1:3 or an oxide with an atomic ratio close to the above atomic ratios.

<Impurity in Oxide Semiconductor>

If an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For that reason, it is preferable that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density which is lower than $8\times10^{11}/cm^3$, preferably lower than $1\times10^{11}/cm^3$, more preferably lower than $1\times10^{10}/cm^3$, and is higher than or equal to $1\times10^{-9}/cm^3$.

<Structure of Oxide Semiconductor>

Next, a structure of an oxide semiconductor will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film will be described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a highly purified intrinsic or substantially highly purified intrinsic state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Further, a halo pattern is shown in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

Note that an oxide semiconductor film may have a structure having physical properties intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In some cases, growth of the crystal part occurs due to the crystallization of the a-like OS film, which is induced by a slight amount of electron beam employed in the TEM observation. In contrast, in the nc-OS film that has good quality, crystallization hardly occurs by a slight amount of electron beam used for TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor film varies depending on the structure in some cases. For example, when the composition of an oxide semiconductor film is determined, the structure of the oxide semiconductor film can be expected by comparing the density of the oxide semiconductor film with the density of a single crystal oxide semiconductor having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film having a density of lower than 78% of the density of the single crystal oxide semiconductor.

Specific examples of the above description are given. For example, in the case of an oxide semiconductor film having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor film having an atomic ratio of In:Ga:Zn=1:1:1, the density of the a-like OS film is higher than or equal to 5.0 $g/cm^3$ and lower than 5.9 $g/cm^3$. For example, in the case of the oxide semiconductor film having an atomic ratio of In:Ga:Zn=1:1:1, the density of each of the nc-OS film and the CAAC-OS film is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

As described above, the OS transistor can achieve highly favorable off-state current characteristics.

Embodiment 5

Although the conductive layers and the semiconductor layers which are described in any of the above embodiments can be formed by a sputtering method, such layers may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in the following manner: the pressure in a chamber is set to an atmospheric pressure or a reduced pressure, and a source gas and an oxidizer are supplied to the chamber at the same time, react with each other in the vicinity of the substrate or over the substrate, and are deposited on the substrate.

Deposition by an ALD method may be performed in the following manner: the pressure in a chamber is set to an atmospheric pressure or a reduced pressure, source gases for reaction are sequentially introduced into the chamber, and then, the sequence of the gas introduction is repeated. For example, two or more kinds of source gases are sequentially supplied to the chamber by switching respective switching valves (also referred to as high-speed valves). In this case, a first source gas is introduced, an inert gas (e.g., argon or nitrogen) or the like is introduced at the same time as the first source gas or after the first source gas is introduced so that the source gases are not mixed, and then, a second source gas is introduced. In the case where the first source gas and the inert gas are introduced at the same time, the inert gas serves as a carrier gas, and the inert gas may also be introduced at the same time as the second source gas. Alternatively, the first source gas may be exhausted by vacuum evacuation instead of the introduction of the inert gas, and then, the second source gas may be introduced. The first source gas is adsorbed on the surface of the substrate to form a first single-atomic layer; then, the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, so that a thin film with excellent step coverage can be formed. The thickness of the thin film can be adjusted by the number of times the sequence of the gas introduction is repeated; therefore, an ALD method makes it possible to accurately adjust thickness and thus is suitable for manufacturing a minute FET.

The conductive films and the semiconductor films which are described in the above embodiments can be formed by a thermal CVD method such as an MOCVD method or an ALD method. For example, in the case where an InGaZnOx (X>0) film is formed, trimethylindium, trimethylgallium, and diethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a tungsten film is formed using a deposition apparatus employing ALD, a $WF_6$ gas and a $B_2H_6$ gas are sequentially introduced plural times to form an initial tungsten film, and then, a $WF_6$ gas and an $H_2$ gas are sequentially introduced plural times to form a tungsten film. Note that an $SiH_4$ gas may be used instead of a $B_2H_6$ gas.

For example, in the case where an oxide semiconductor film, e.g., an InGaZnOx (X>0) film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are sequentially introduced plural times to form a GaO layer, and then, a $Zn(CH_3)_2$ gas and an $O_3$ gas are sequentially introduced plural times to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing these gases. Although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Embodiment 6

In this embodiment, application examples of the storage system described in the above embodiment will be described with reference to FIG. 20 and FIGS. 21A and 21B.

Figure 20:
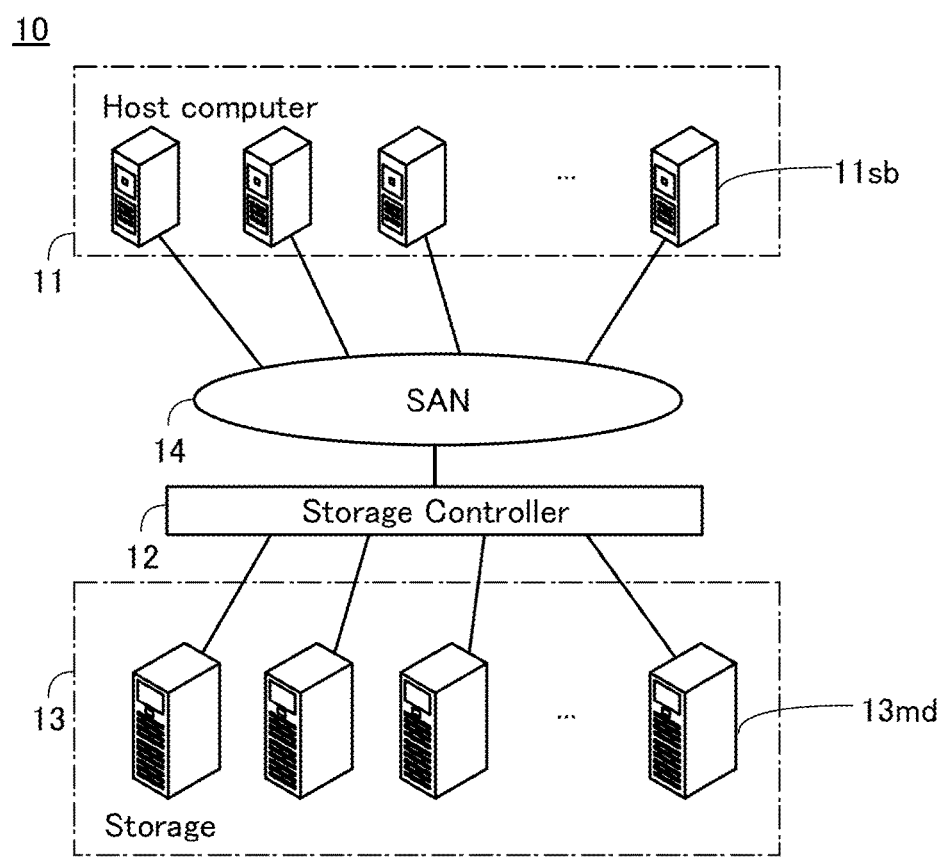
FIG. 20 illustrates a storage system to which one embodiment of the present invention can be applied.

A storage system 10 illustrated in FIG. 20 includes a plurality of servers 11*sb* as the host 11 (indicated as "Host computer" in the diagram) and a plurality of memory devices 13*md* as the storage 13 (indicated as "Storage" in the diagram). In the illustrated example, the host 11 and the storage 13 are connected to each other through a storage area network 14 (indicated as "SAN" in the diagram) and the storage control circuit 12 (indicated as "Storage Controller" in the diagram). Although FIG. 20 illustrates a configuration in which the storage system 10 includes the host 11, the storage system 10 may consist of the storage control circuit 12 and the storage 13.

Figure 21A:
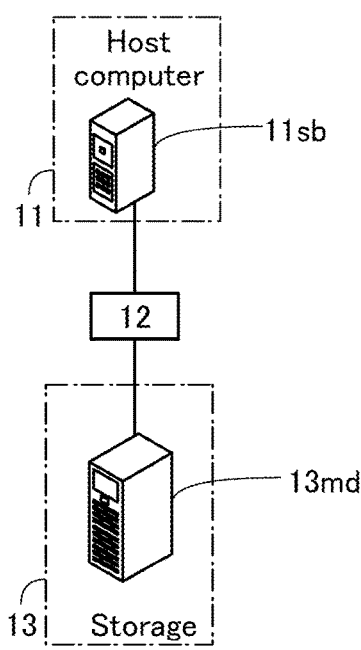
FIGS. 21A and 21B each illustrate a storage system to which one embodiment of the present invention can be applied.

In an example of a storage system 10A illustrated in FIG. 21A, one server 11*sb* of the host 11 is connected to one memory device 13*md* of the storage 13 through the storage control circuit 12. The storage system 10A illustrated in FIG. 21A is what is called a direct attached storage (DAS).

Figure 21B:
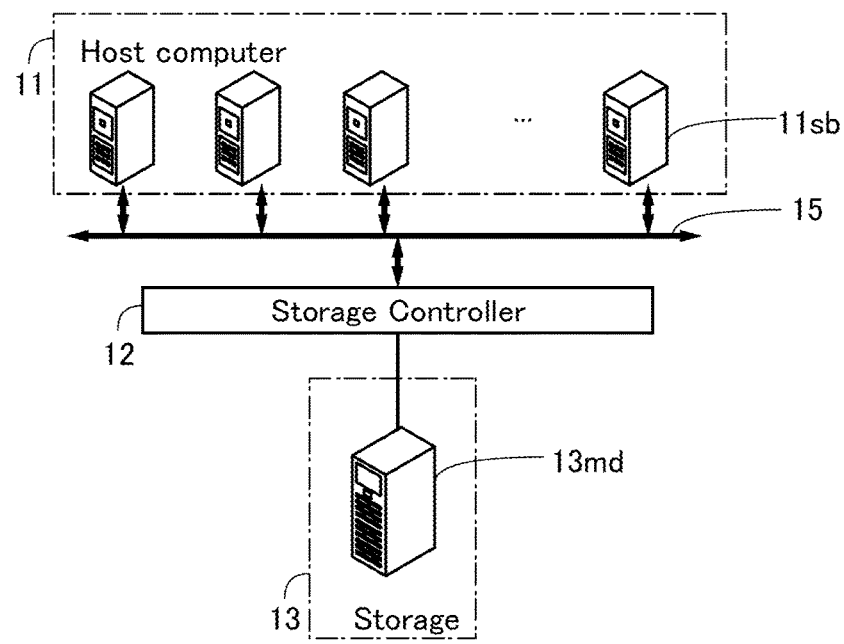

In an example of a storage system 10B illustrated in FIG. 21B, a plurality of servers 11*sb* of the host 11 are connected to a memory device 13*md* of the storage 13 through a local area network 15 (LAN) and the storage control circuit 12. The storage system 10B illustrated in FIG. 21B is what is called a network attached storage (NAS).

Each configuration of the storage systems described above can employ the configuration described in the above embodiment. Accordingly, a storage system with reduced power consumption can be achieved.

(Supplementary Notes on the Description in this Specification and the Like)

The following are notes on the description of the above embodiments and structures in the embodiments.

Notes on One Embodiment of the Present Invention Described in Embodiments

One embodiment of the present invention can be constituted by appropriately combining the structure described in an embodiment with any of the structures described the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

In this embodiment, one embodiment of the present invention has been described. Other embodiments of the present invention are described in the other embodiments. Note that one embodiment of the present invention is not limited thereto. In other words, since various embodiments of the invention are described in this embodiment and the other embodiments, one embodiment of the present invention is not limited to a particular embodiment. The example in which the OS transistor is used as the transistor with low off-state current has been described above as one embodiment of the present invention; however, one embodiment of the present invention is not limited thereto. For example, depending on circumstances or conditions, in one embodiment of the present invention, a variety of materials other than that of the OS transistor may be used.

<Notes on the Description for Drawings>

In this specification and the like, terms for describing arrangement, such as "over" and "under," are used for convenience for describing the positional relation between components with reference to drawings. The positional relation between components is changed as appropriate in accordance with a direction in which each component is described. Thus, terms for describing arrangement are not limited to those used in this specification and can be changed to other terms as appropriate depending on the situation.

The term "over" or "under" does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, the segmentation of a block in the block diagrams is not limited by any of the components described in the specification, and can be differently determined as appropriate depending on situations.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as a plan view or a layout view) and a perspective view, some of components might not be illustrated for clarity of the drawings.

<Notes on Expressions that can be Rephrased>

In this specification or the like, in description of connections of a transistor, one of a source and a drain is referred to as "one of a source and a drain" (or a first electrode or a first terminal), and the other of the source and the drain is referred to as "the other of the source and the drain" (or a second electrode or a second terminal). This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" or "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film," "layer," and the like can be interchanged with each other depending on the case or circumstances. For example, the term "conductive layer" can be changed into the term "conductive film" in some cases. Also, the term "insulating film" can be changed into the term "insulating layer" in some cases.

<Notes on Definitions of Terms>

The following are definitions of the terms not mentioned in the above embodiments.

<<Switch>>

In this specification and the like, a switch is in a conductive state (on state) or in a non-conductive state (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, a distance between a source and a drain in a region where a semiconductor (or a portion where a current flows in a semiconductor when a transistor is on) and a gate overlap with each other or a region where a channel is formed in a plan view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value, in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed.

In one transistor, channel widths in all regions are not necessarily the same. In other words, the channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a plan view of the transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

<<Connection>>

In this specification and the like, the expression "A and B are connected" or "A is connected to B" means the case where A and B are electrically connected to each other as well as the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

This application is based on Japanese Patent Application serial no. 2015-036039 filed with Japan Patent Office on Feb. 26, 2015, the entire contents of which are hereby incorporated by reference.

What is claimed is:

1. A storage system comprising:
a storage;
a storage control circuit; and
a host,
wherein the storage control circuit comprises a controller, a cache memory, and a power storage device,
wherein the controller controls data input and output between the storage and the host by access of the host,
wherein the cache memory comprises a first transistor,
wherein the first transistor retains a charge based on the data by being turned off,
wherein the power storage device supplies power for turning off the first transistor in a state where power supply from outside is stopped, and
wherein, in the state where power supply from outside is stopped, the power storage device supplies power to the cache memory at regular intervals.

2. The storage system according to claim 1, wherein the first transistor comprises an oxide semiconductor in a channel formation region.

3. The storage system according to claim 1, further comprising a capacitor,
wherein the first transistor is electrically connected to the capacitor, and
wherein the first transistor retains the charge based on the data in the capacitor by being turned off.

4. The storage system according to claim 1, further comprising a second transistor and a node,
wherein the node is electrically connected to one of a source electrode and a drain electrode of the first transistor and a gate electrode of the second transistor, and
wherein the first transistor retains the charge based on the data in the node by being turned off.

5. The storage system according to claim 1, further comprising a timer,
wherein the storage control circuit comprises the timer,
wherein the data is refreshed before the timer starts to measure a period in the state where power supply from outside is stopped, and
wherein the data is refreshed under control of the timer after the timer starts to measure the period in the state where power supply from outside is stopped.

6. The storage system according to claim 1, wherein the power storage device is a secondary battery.

7. The storage system according to claim 1, wherein, in the state where power supplied from outside is stopped, the data in the cache memory is refreshed intermittently.

8. A storage control circuit comprising:
a controller;
a cache memory; and
a power storage device,
wherein the controller controls data input and output between a storage and a host by access of the host,
wherein the cache memory comprises a first transistor,
wherein the first transistor retains a charge based on the data by being turned off,
wherein the power storage device supplies power for turning off the first transistor in a state where power supply from outside is stopped, and
wherein, in the state where power supply from outside is stopped, the power storage device supplies power to the cache memory at regular intervals.

9. The storage control circuit according to claim 8, wherein the first transistor comprises an oxide semiconductor in a channel formation region.

10. The storage control circuit according to claim 8, further comprising a capacitor,
wherein the first transistor is electrically connected to the capacitor, and
wherein the first transistor retains the charge based on the data in the capacitor by being turned off.

11. The storage control circuit according to claim 8, further comprising a second transistor and a node,
wherein the node is electrically connected to one of a source electrode and a drain electrode of the first transistor and a gate electrode of the second transistor, and
wherein the first transistor retains the charge based on the data in the node by being turned off.

12. The storage control circuit according to claim 8, wherein the power storage device is a secondary battery.

13. The storage control circuit according to claim 8, further comprising a timer,
wherein the data is refreshed before the timer starts to measure a period in the state where power supply from outside is stopped, and
wherein the data is refreshed under control of the timer after the timer starts to measure the period in the state where power supply from outside is stopped.

14. The storage control circuit according to claim 8, wherein, in the state where power supplied from outside is stopped, the data in the cache memory is refreshed intermittently.

* * * * *